(12) United States Patent
Kapels et al.

(10) Patent No.: US 7,087,981 B2
(45) Date of Patent: Aug. 8, 2006

(54) METAL SEMICONDUCTOR CONTACT, SEMICONDUCTOR COMPONENT, INTEGRATED CIRCUIT ARRANGEMENT AND METHOD

(75) Inventors: Holger Kapels, Holzkirchen (DE); Anton Mauder, Kolbermoor (DE); Hans-Joachim Schulze, Ottobrunn (DE); Helmut Strack, München (DE); Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/419,597

(22) Filed: Apr. 21, 2003

(65) Prior Publication Data

US 2004/0084724 A1    May 6, 2004

(30) Foreign Application Priority Data

Apr. 19, 2002   (DE)   .............................. 102 17 610

(51) Int. Cl.
*H01L 29/207*   (2006.01)
(52) U.S. Cl. ..................................... 257/610; 257/612
(58) Field of Classification Search ............... 438/918, 438/925, 968; 257/471, 475, 610, 612, E29.148
See application file for complete search history.

(56) References Cited

U.S. PATENT DOCUMENTS

| | | | | |
|---|---|---|---|---|
| 3,765,940 A | | 10/1973 | Hentzschel | .................. 438/385 |
| 4,063,210 A | | 12/1977 | Coliver | ........................... 338/7 |
| 4,107,835 A | | 8/1978 | Bindell et al. | ............... 438/530 |
| 4,344,980 A | | 8/1982 | Yoder | .......................... 438/523 |
| 4,350,541 A | | 9/1982 | Mizushima et al. | ......... 438/559 |
| 4,377,030 A | * | 3/1983 | Pettenpaul et al. | .......... 438/167 |
| 4,489,480 A | * | 12/1984 | Martin et al. | ................ 438/174 |
| 5,093,274 A | * | 3/1992 | Kohno | ........................ 438/593 |
| 5,123,752 A | * | 6/1992 | Paz-Pujalt et al. | ........... 374/153 |
| 5,124,770 A | * | 6/1992 | Umemoto et al. | ........... 257/192 |
| 5,216,275 A | | 6/1993 | Chen | |

(Continued)

FOREIGN PATENT DOCUMENTS

DE          30 30 660 C2       3/1981

(Continued)

OTHER PUBLICATIONS

A. Yamamoto et al.: "Annealing Effect on Thermoelectric Properties of Bi implanted Si Thin Film", *20th International Conference on Thermoelectrics*, 2001, pp. 306-309.

*Primary Examiner*—Mary Wilczewski
*Assistant Examiner*—Toniae M. Thomas
(74) *Attorney, Agent, or Firm*—Laurence A. Grenberg; Werner H. Stemer; Ralph E. Locher

(57) ABSTRACT

The present invention relates to a metal-semiconductor contact comprising a semiconductor layer and comprising a metallization applied to the semiconductor layer, a high dopant concentration being introduced into the semiconductor layer such that a non-reactive metal-semiconductor contact is formed between the metallization and the semiconductor layer. The metallization and/or the semiconductor layer are formed in such a way that only a fraction of the introduced doping concentration is electrically active, and a semiconductor layer doped only with this fraction of the doping concentration only forms a Schottky contact when contact is made with the metallization. Furthermore, the invention relates to a semiconductor component comprising a drain zone, body zones embedded therein and source zones again embedded therein. The semiconductor component has metal-semiconductor contacts in which the contacts made contact only with the source zones but not with the body zones.

12 Claims, 13 Drawing Sheets

U.S. PATENT DOCUMENTS

| | | | |
|---|---|---|---|
| 5,283,202 A | 2/1994 | Pike, Jr. et al. | 438/543 |
| 5,438,215 A | 8/1995 | Tihanyi | |
| 5,754,310 A | 5/1998 | Aoki et al. | |
| 6,054,369 A * | 4/2000 | Neilson et al. | 438/455 |
| 6,130,145 A | 10/2000 | Ilg et al. | 438/592 |
| 6,504,230 B1 * | 1/2003 | Deboy et al. | 257/547 |
| 6,630,698 B1 | 10/2003 | Deboy et al. | |
| 6,645,838 B1 * | 11/2003 | Talwar et al. | 438/530 |
| 6,825,101 B1 * | 11/2004 | Hawryluk et al. | 438/483 |

FOREIGN PATENT DOCUMENTS

| | | |
|---|---|---|
| DE | 39 12 056 A1 | 10/1990 |
| DE | 39 13 123 A1 | 10/1990 |
| EP | 0 656 661 B1 | 6/1995 |
| JP | 360049674 * | 3/1985 |
| WO | 01/80300 A1 | 10/2001 |

* cited by examiner

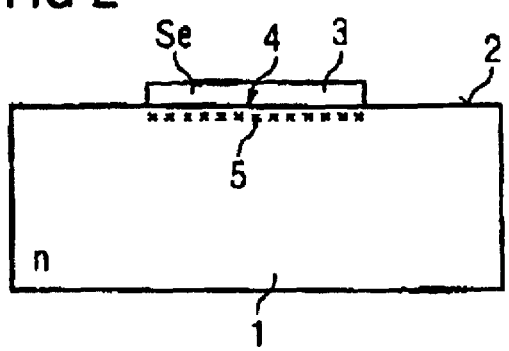
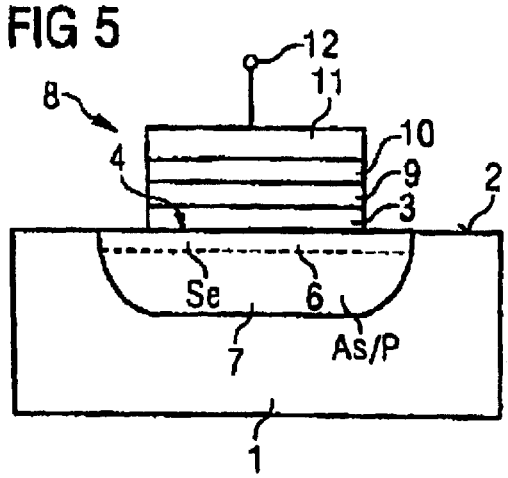
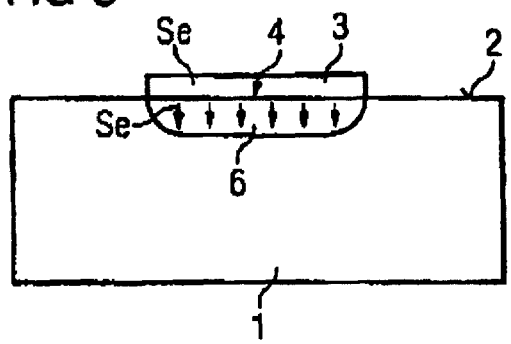
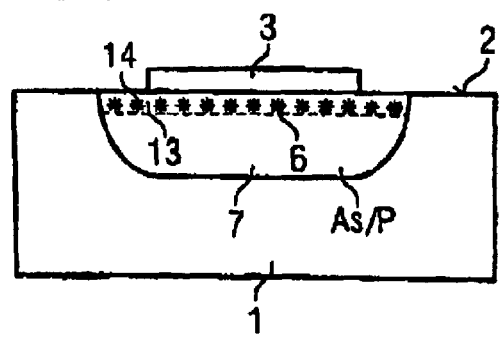
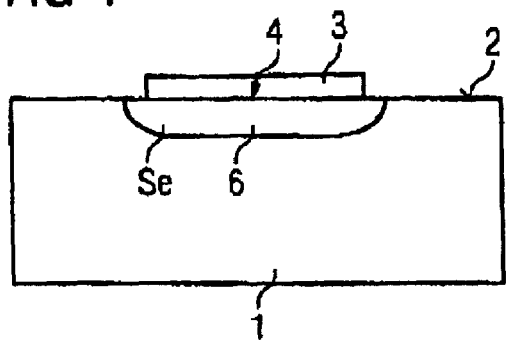

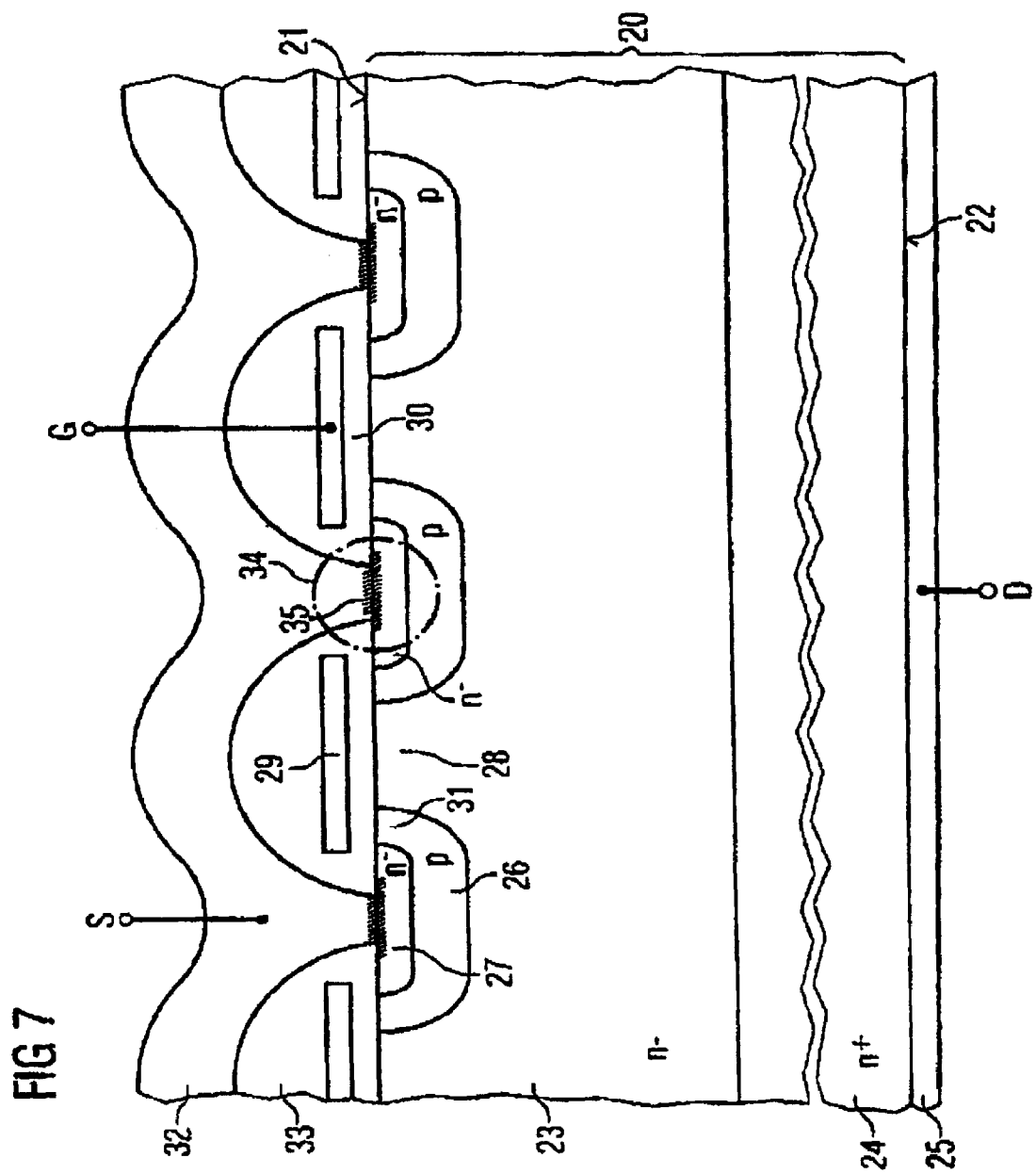

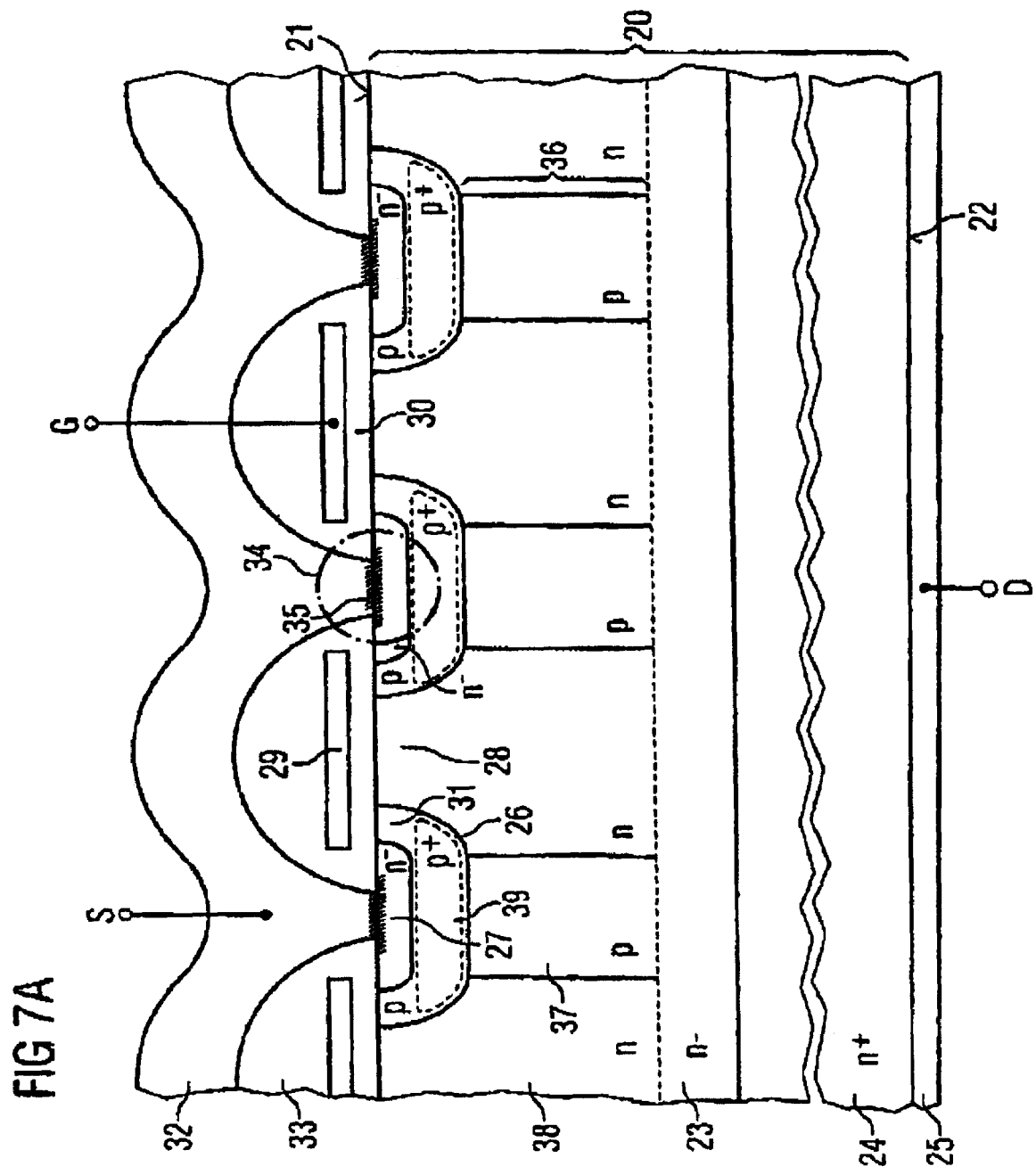

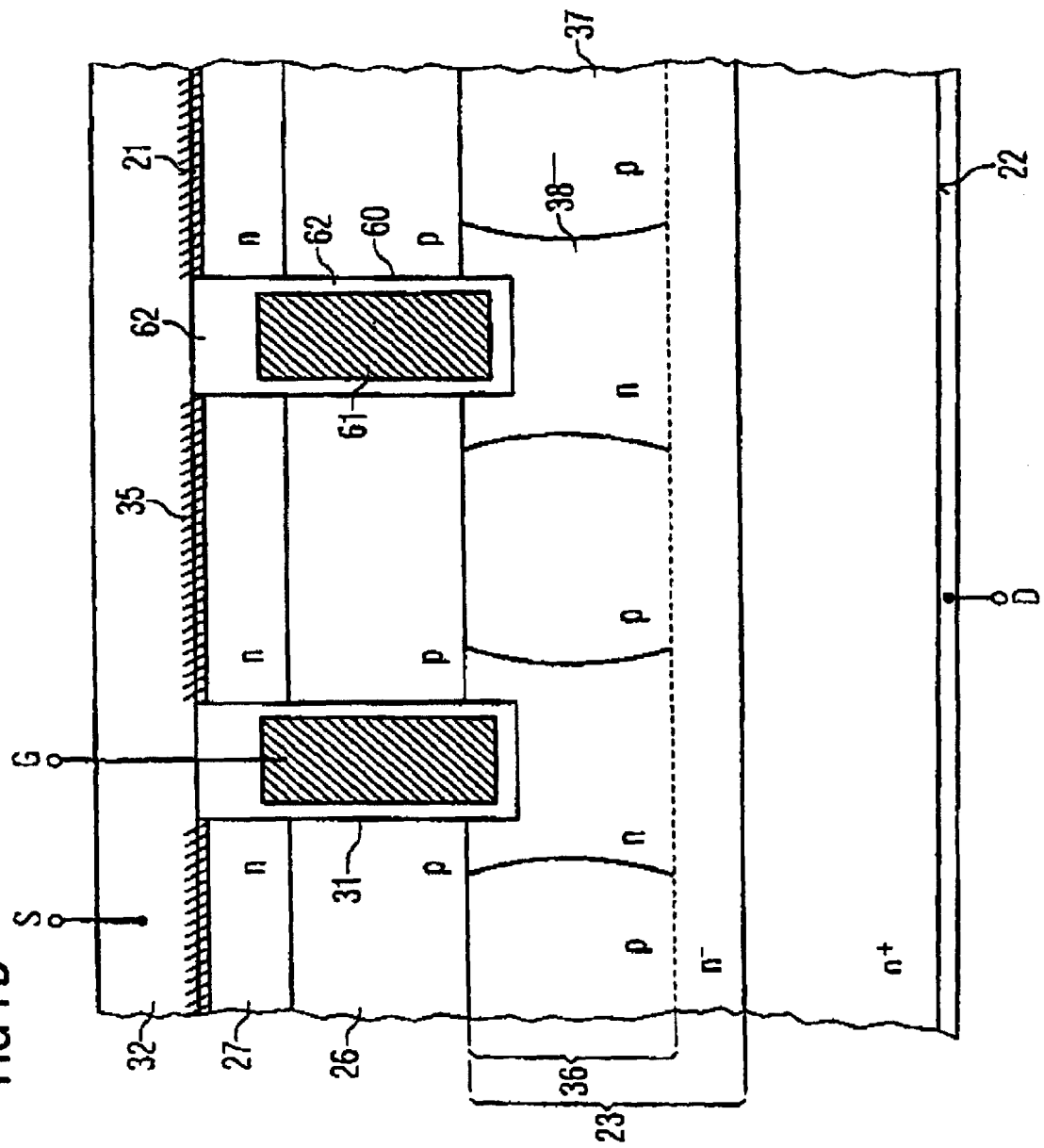

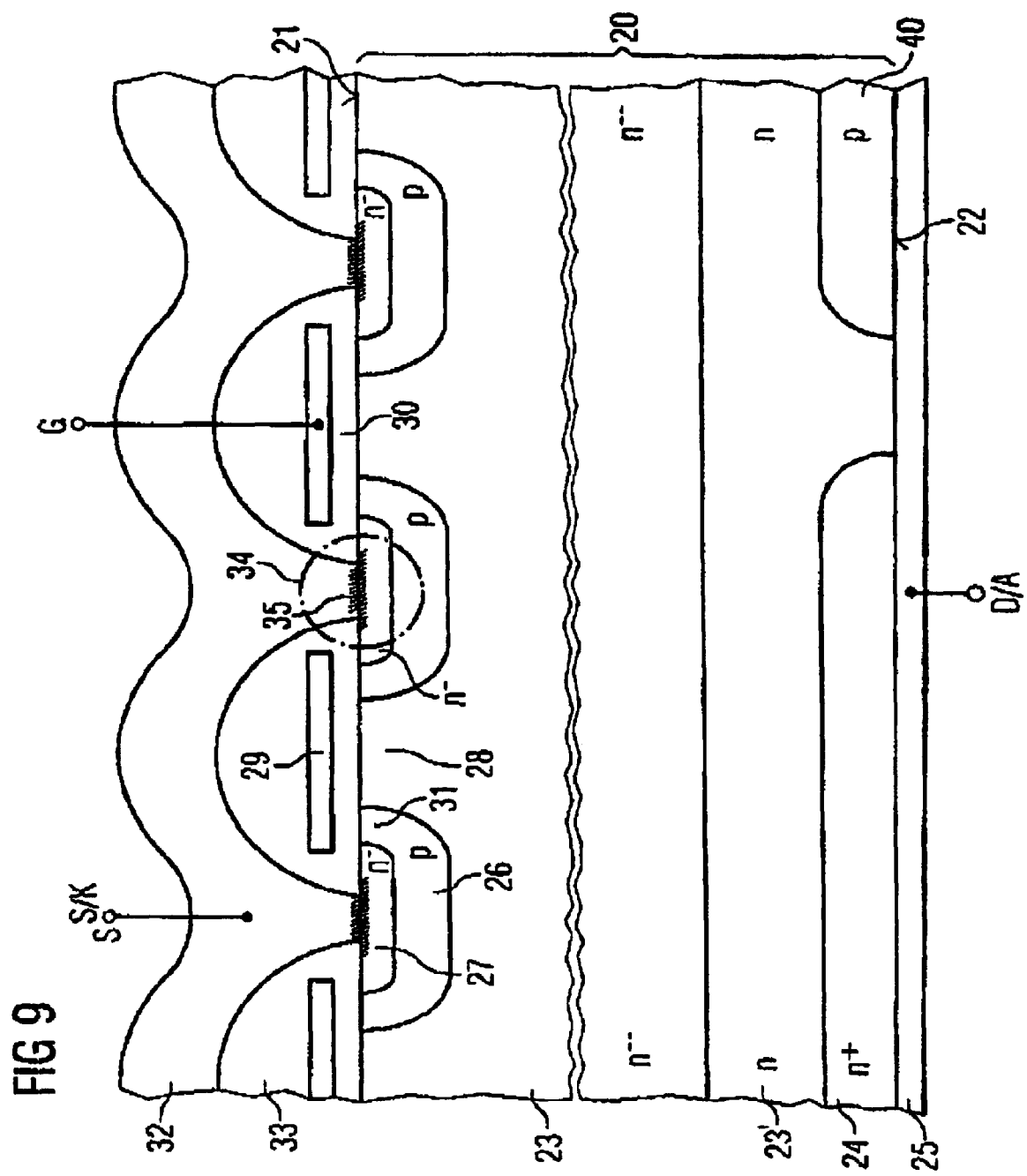

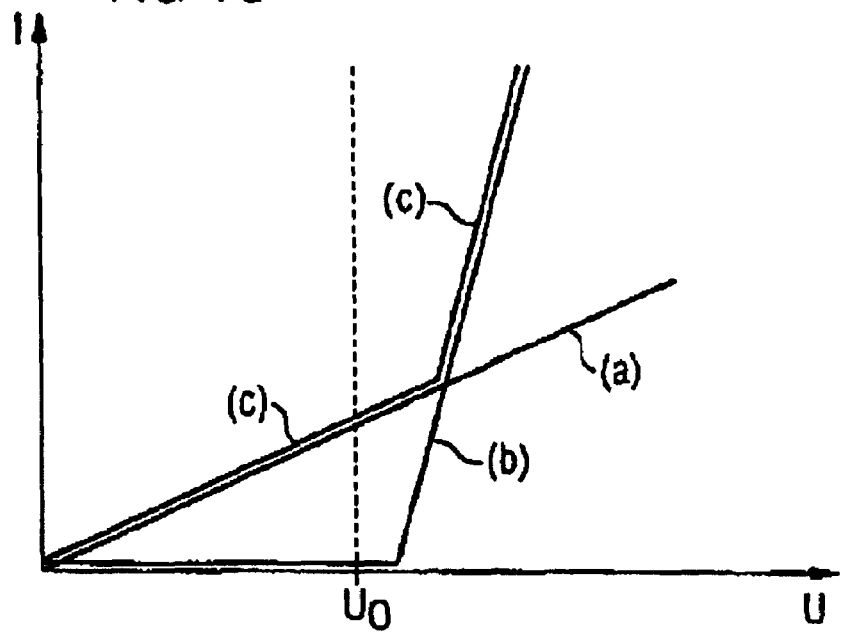
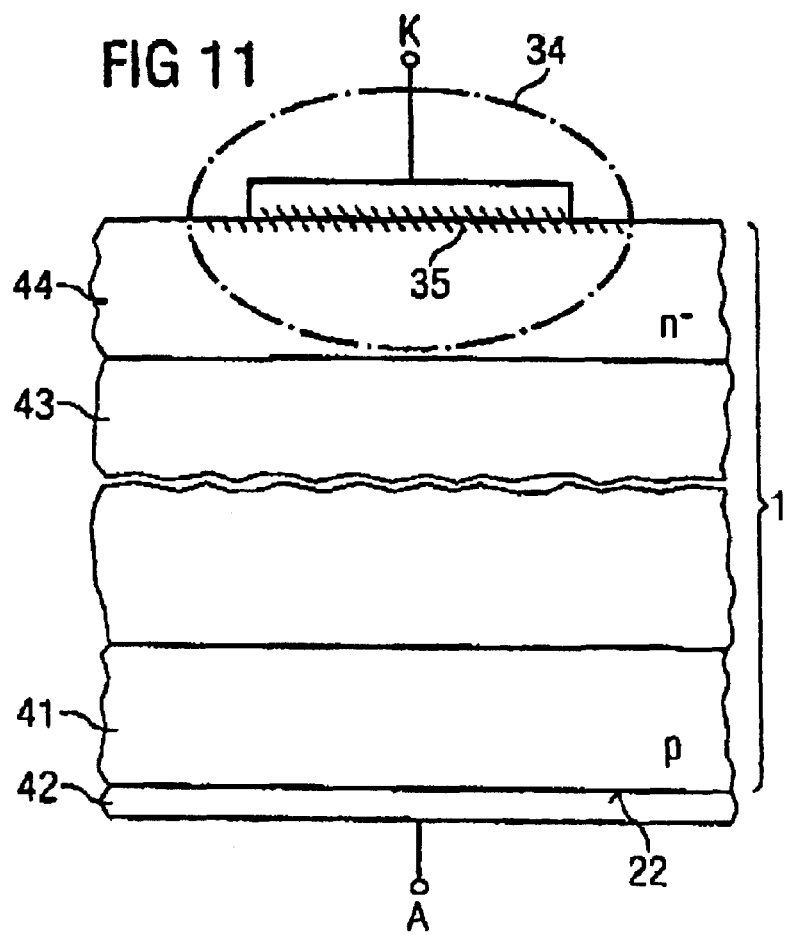

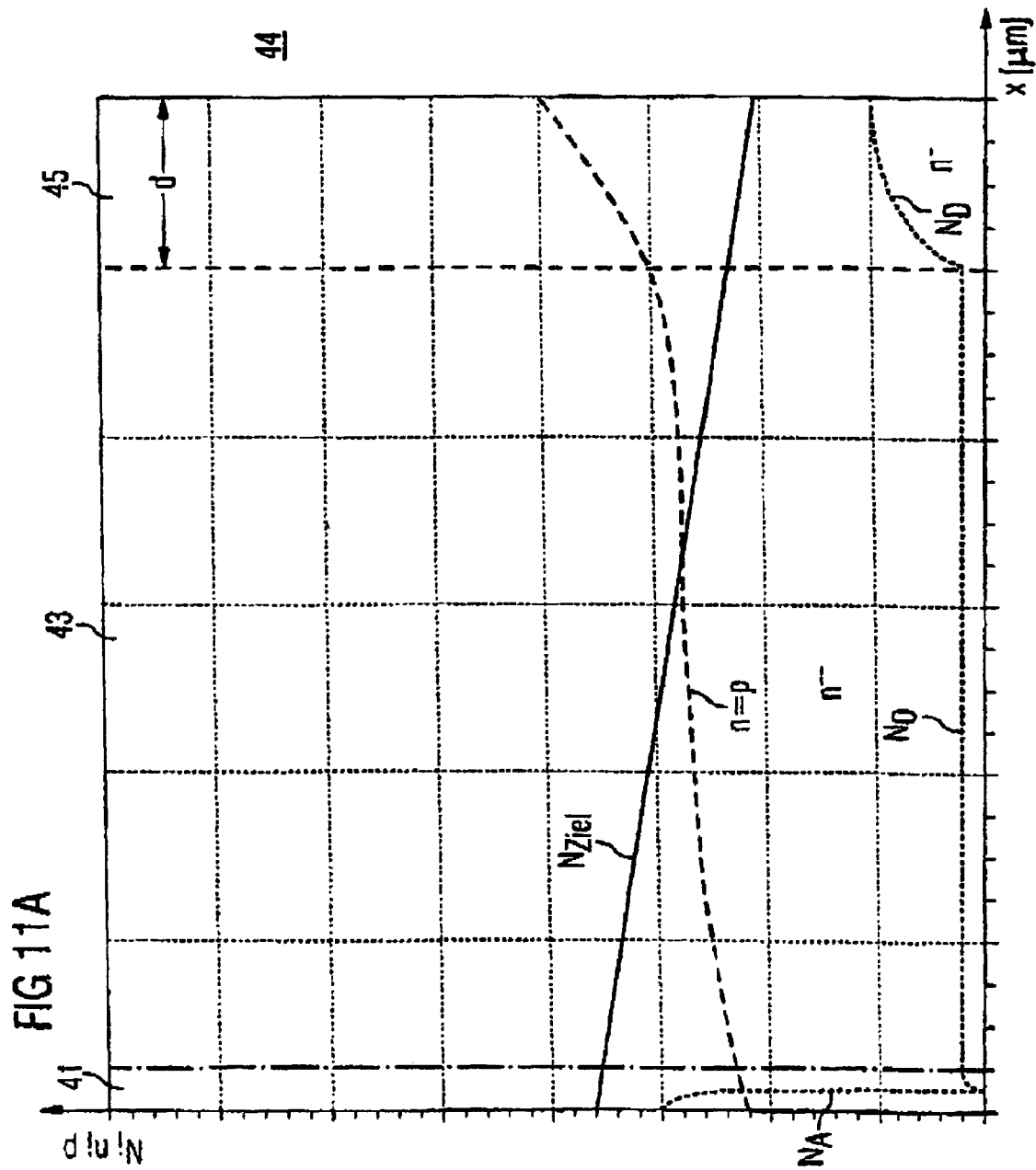

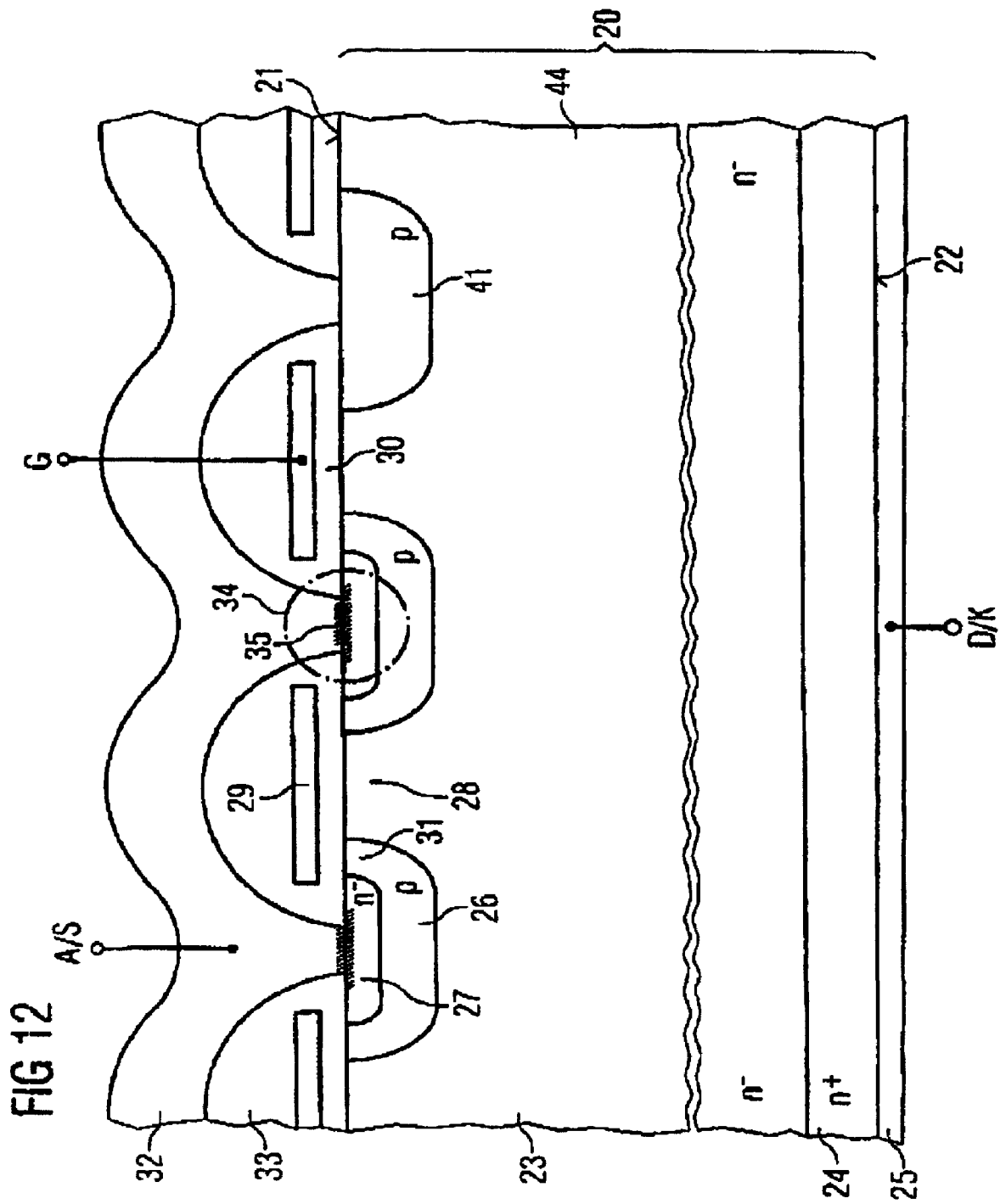

METAL SEMICONDUCTOR CONTACT, SEMICONDUCTOR COMPONENT, INTEGRATED CIRCUIT ARRANGEMENT AND METHOD

BACKGROUND OF THE INVENTION

Field of the Invention

The invention relates to non-reactive contacts on a semiconductor body in general and, in particular to non-reactive contacts specifically for making contact with semiconductor elements. Such contacts are generally known and therefore do not require any further explanation.

The function of a low-resistance, electrical connection from the electrodes of an integrated semiconductor component to the "outside world" or different semiconductor components of an integrated circuit among one another is in most cases performed by highly conductive metal layers or metal alloys. Metal silicide layers or highly doped polysilicon can likewise be used here, but these will not be discussed in more detail below. The main requirement on metallic materials for making contact with a semiconductor body is the lowest possible layer resistance. Furthermore, the material should exhibit highly adhesive characteristics and, if possible, bring about no uncontrollable alloying processes when making contact with the semiconductor body. The highly conductive materials used are therefore in particular aluminum, gold, silver, copper, titanium, platinum and the like. Because of its ability to be processed simply, aluminum is particularly advantageously suitable as a contact material, in particular for contacts on p-contact material, in particular for contacts on p-doped silicon substrate.

In the case of metal-semiconductor contacts, a distinction is drawn with regard to their function as purely non-reactive contacts and Schottky contacts. The non-reactive contacts are required when making contact with all semiconductor components if the metal is to fulfill only the purpose of making contact, while Schottky contacts or diodes are used as rectifiers. In a certain way, a non-reactive contact is a specific exemplary embodiment of a Schottky contact, but which has a very narrow potential barrier. In the case of non-reactive contacts, the highly nonlinear diode characteristic which is characteristic of Schottky contacts is intended to be used deliberately. For this purpose, the semiconductor doping is increased at the contact point in such a way that the breakdown voltage at the metal-semiconductor junction decreases and the result is therefore a Schottky contact with a particularly narrow space charge zone, in the nanometer range. In the case of a very high semiconductor doping, the potential barrier between semiconductor and metal is no longer overcome by thermo ionic emission but it is traversed by the charge carriers via the quantum mechanical tunnel effect. It is important here that the semiconductor is so highly doped that the tunneling probability, even at a voltage of $U=0$ volt, is sufficiently high, so that the metal-semiconductor contact loses its blocking capability and is highly conductive in both directions (non-reactive contact).

In the case of electric contacts on p-doped semiconductor material, because of the band structure, there is a non-reactive contact even at relatively low doping. By contrast, electric contacts on n-doped semiconductor material are virtually always formed as Schottky contacts because of the high band spacing. The barrier height of the band spacing depends on the metal and its electron work function. A non-reactive contact on n-doped semiconductor material is made only when the electrons tunnel through the very steep but narrow barrier, for which reason correspondingly high doping is required. The contact which results from this therefore supplies an approximately non-reactive characteristic curve.

For this reason, aluminum on p-doped silicon ensures a good non-reactive contact ($10^{-5}$ S$\mu$m$^{-2}$) even with relatively low basic doping ($10^{16}$ cm$^{-3}$), while on n-doped silicon, a very much higher basic doping (greater than $10^{19}$ cm$^{-3}$) is required. The other contact materials normally used, such as gold and copper, are no better than aluminum when making contact with n-silicon.

When making contact with an n-doped semiconductor body, very high basic doping in the contact region therefore has to be tolerated in order to obtain the desired requirements on the non-reactive contact. However, a degree of freedom in the design is lost as a result, since semiconductor components with which contact is made in this way are already defined in terms of the minimum doping concentration with regard to their contact region.

A restriction which results from this is to be explained below by way of example by using a conventional MOS transistor—also referred to as a MOSFET in brief—but without restricting the invention to this semiconductor component. FIG. 1 shows a vertical power-D-MOSFET, as illustrated for example in Stengl, Tihanyi, "Leistungs-MOS-FET-Praxis" [Power MOSFET Practise], Pflaum-Verlag, Munich, 1992, particularly in FIG. 2.3.1 there.

As a result of the sequence of doped regions of different conductivity type present in a MOSFET, the latter always has a parasitic bipolar transistor T1. These semiconductor regions consist of an n-p-n structure in the case of an n-channel MOSFET. The parasitic bipolar transistor T1 which results from this is thus an npn bipolar transistor, whose collector, base and emitter zone are formed from the source zone 27, the body zone 26 and the drain zone 23, 24 of the MOSFET. The effects of the parasitic bipolar transistor are greater the higher the current amplification factor $\beta=IC/IB$. The current amplification factor $\beta$ depends on the dopant doses or the ratio of the doses in the source and body region. Here, the dopant dose designates the integral dopant concentration in the respective region. A very high doping concentration in the n-doped source zone 27 therefore has the effect of a very high current amplification factor $\beta$ and therefore a reduced turn-on threshold of the parasitic bipolar transistor. It will therefore be necessary to strive to keep the current amplification factor $\beta$ as low as possible, in order as a result also to eliminate the influence of the parasitic bipolar transistor to the greatest possible extent. However, because of the restricted degree of freedom in dimensioning the dopant concentration in the source zone 27, this is possible only to a limited extent.

In order nevertheless to prevent the effects of this parasitic bipolar transistor on the faulty resistance of the MOSFET, the source zone and the body zone of the MOSFET (or else the substrate) are usually short-circuited to each other via a shunt. Although, in the literature, the representation of the source-body short-circuit is often omitted, those skilled in the art, in the technical implementation of such a representation without a source-body short-circuit, would necessarily provide a short-circuit between source and body.

If the source zone and the body zone were not short-circuited to each other in a previously known MOSFET, charge carriers could accumulate in the body zone during the operation of the MOSFET, that is to say when a flux voltage or a low reverse voltage is applied. These charges would give rise to a voltage drop between body and source zone, which would activate the parasitic bipolar transistor T1 even at low currents across the pn junction between body and source. The undesired "second breakdown" (latch-up effect) occurs, which generally leads to the destruction of the MOSFET. The MOSFET could therefore no longer be controlled via its gate terminal. This latch-up effect ultimately also leads to the voltage resistance of such a MOSFET in the drain-source direction being only about ⅓ of the voltage resistance of a MOSFET with short-circuited body and source zone. By contrast, the short-circuit between body and source zone has the effect that source and body zone are always at the same potential, so that no charge carriers can accumulate in the substrate.

However, short-circuiting source and body zone has the disadvantage that the MOSFET blocks only in one direction, the drain-source direction, which is normally designated the forward direction, while it conducts like a diode (inverse diode) when a flux voltage is applied in the source-drain direction, which is designated the reverse direction.

In many applications, however, it is desirable to use a semiconductor switch which blocks adequately in both directions, specifically even when no drive potential is applied. In the case of the conventional MOSFET with a short-circuit between source and body zone, this can be achieved only by means of very complicated additional circuit measures. In EP 0 656 661, it is proposed for this purpose to replace the short-circuit by a conductive connection with a resistor, in order to increase the voltage drop over the component when a voltage is applied in the reverse direction.

Because of the highly restricted blocking characteristics in the reverse direction, a MOSFET is only conditionally suitable in full- and half-bridge circuits, in particular at higher reverse voltages, for example above 250 V. On the other hand, at low reverse voltages, the switching losses in these circuit applications are very high.

SUMMARY OF THE INVENTION

The present invention is therefore based on the object of providing a greater degree of freedom when making contact with semiconductor layers, in particular when making contact with n-doped semiconductor layers.

Furthermore, in particular in the case of semiconductor switches which can be controlled by the field effect, the reverse blocking capability is to be improved without the latch-up resistance being affected detrimentally thereby.

Accordingly, the Following are Provided:
a metal-semiconductor contact having a doped semiconductor layer and having a metallization applied to the semiconductor layer, which form a non-reactive metal-semiconductor contact, a first doping material being provided for doping the semiconductor layer, said material having the property that the electrically effective doping concentration in the semiconductor layer is always a fraction of the doping concentration introduced into the semiconductor layer, and that the semiconductor layer which is doped only with a second doping material which does not have the property of the first doping material, with a doping concentration introduced in accordance with the fraction, forms a Schottky contact with the metallization;

a generic semiconductor component, in which the source electrode is connected only to a semiconductor layer arranged within the source zone;

an integrated circuit, in which two MOSFETs arranged in a half-bridge arrangement are provided, which are connected in series with each other via their load paths and are connected between a first terminal having a first supply potential and a second terminal having a second supply potential, each MOSFET being assigned a co-integrated freewheeling diode, which is connected in parallel with the load path of the semiconductor component assigned to it;

a method of producing a metal-semiconductor contact in which, following the application of a metal for the metal-semiconductor contact, the regions of the semiconductor layer near to the surface and immediately under the metal-semiconductor contact are subjected to a temperature treatment and/or a process for producing damage.

In a complete departure from previous contact-making methods, in the present invention a non-reactive metal-semiconductor contact is provided on a very lowly doped (effective, that is electrically effective doping) semiconductor layer, it being possible hitherto to achieve only a Schottky contact, that is a contact with substantially nonlinear current-voltage characteristics, using conventional dopings (such as phosphorus) or known contact-making methods. Using these novel contacts, inter alia novel MOSFETs and IGBTs, in which the source-body short-circuit is dispensed with, can be provided. In particular in the case of MOSFETs, the response of the parasitic bipolar transistor can specifically be prevented by very low doping in the source zones, so that the MOSFET has a very high latch-up resistance and, as a result of the lack of the inverse diode, likewise has a higher reverse blocking capability.

With the invention, an integrated MOSFET/IGBT arrangement can be produced in which the MOSFETs and IGBT are integrated in a semiconductor body and connected in parallel with each other. In the same way, an integrated MOSFET/freewheeling diode arrangement can be provided. Using these novel semiconductor components, half-bridge circuits and full-bridge circuits with reverse blocking capability (of a few volts) can be provided. The MOSFET switches are intended to block in reverse, and for this purpose the optimized diodes should conduct in reverse.

In the case of n-doped layers with which contact is to be made, selenium and bismuth are suitable as dopants, since these substances firstly have a very low solubility in silicon and, moreover, act in an n-doping manner in silicon. In the case of p-doped semiconductor layers, palladium is primarily suitable.

Further advantageous refinements and developments of the invention can be gathered from the subclaims and the description with reference to the drawing.

BRIEF DESCRIPTION OF THE DRAWINGS

FIG. 2 shows, in a simplified cross section, a first exemplary embodiment of a metal-semiconductor contact according to the invention on an n-doped semiconductor layer;

FIG. 3 shows, in a simplified cross section, a second exemplary embodiment of a metal-semiconductor contact according to the invention;

FIG. 4 shows, in a simplified cross section, a third exemplary embodiment of a metal-semiconductor contact according to the invention;

FIG. 5 shows, in a simplified cross section, a fourth, very advantageous exemplary embodiment of a metal-semiconductor contact according to the invention;

FIG. 6 shows, in a simplified cross section, a fifth exemplary embodiment of a metal-semiconductor contact according to the invention;

FIG. 7 shows, in a part section, a first application of the metal-semiconductor contact according to the invention for making contact with the source zones of a vertical n-channel power-D-MOSFET;

FIG. 7a shows, in a part section, a MOSFET according to the invention on the principle of charge carrier compensation;

FIG. 7b shows, in a part section, a MOSFET constructed in trench technology on the principle of charge carrier compensation;

FIG. 9 shows, in a part section, a third application of the metal-semiconductor contact according to the invention in an integrated arrangement with MOSFETs and IGBTs connected in parallel with one another;

FIG. 10 shows the current-voltage characteristic of the arrangement corresponding to FIG. 9;

FIG. 11 shows, in a part section, a fourth application of the metal-semiconductor contact according to the invention for making contact with the cathode zones of a vertical pin power diode;

FIG. 11a shows the charge carrier concentration in the forward operation of a pin power diode corresponding to FIG. 11;

FIG. 12 shows, in a part section, a fifth application of the metal-semiconductor contact according to the invention in an integrated arrangement having a MOSFET and a co-integrated freewheeling diode arranged in parallel therewith;

DESCRIPTION OF THE PREFERRED EMBODIMENTS

Figure 1:
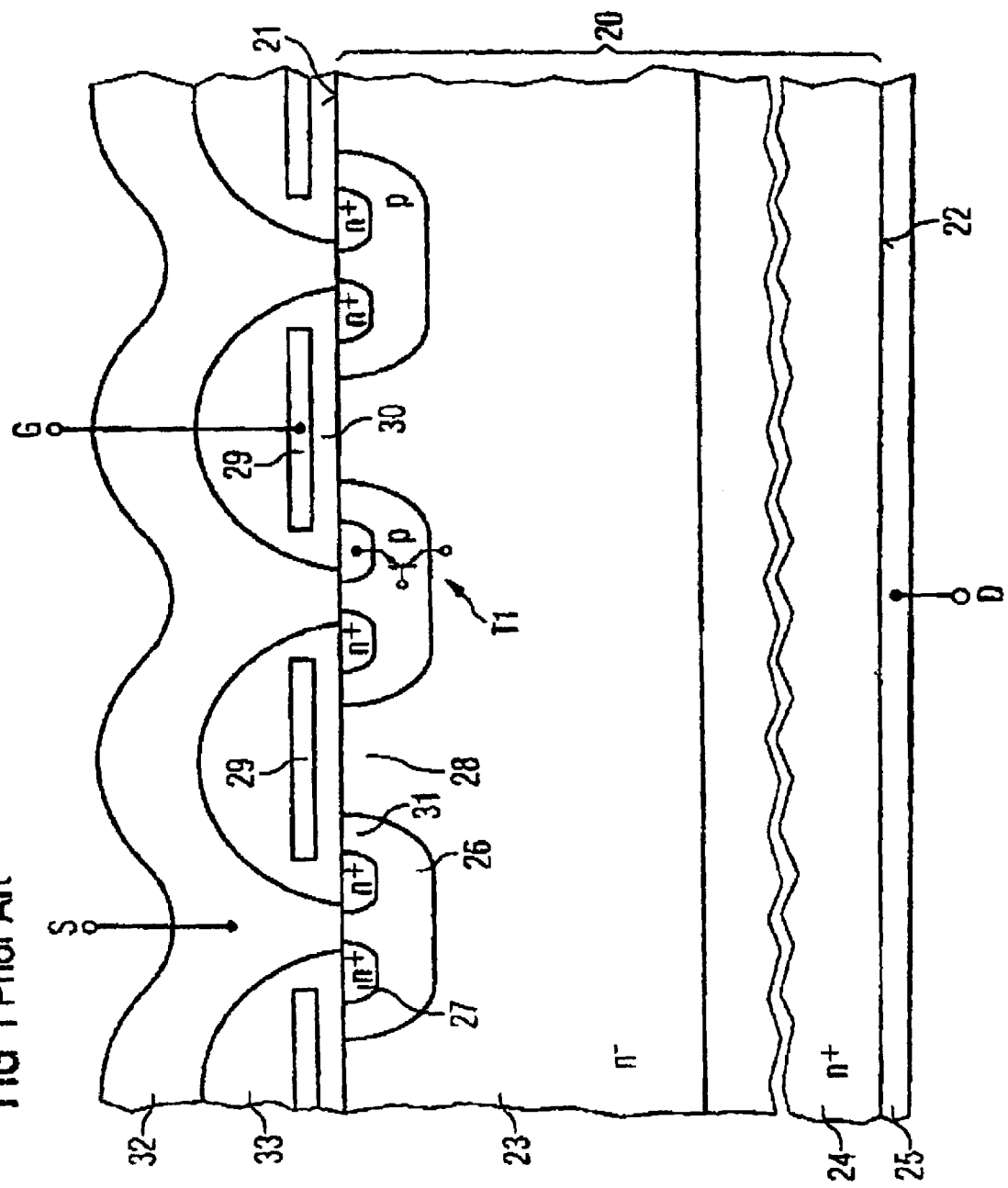
FIG. 1 shows, in a part section, the structure of a vertical MOSFET with contacts according to the prior art.

In all the figures of the drawing, identical or functionally identical elements, if not otherwise specified, are provided with the same reference symbols.

The following embodiments relate to the production of a contact on an n-doped semiconductor layer, since here the problem of making contact, as was explained extensively at the beginning, is most serious and the advantage of the invention is therefore greatest. However, of course the invention can very advantageously be applied in the production of non-reactive contacts of p-doped or undoped or else on polycrystalline semiconductor layers as well.

FIG. 2 shows, in a simplified cross section, a first exemplary embodiment of a semiconductor contact according to the invention. In FIG. 2, a semiconductor layer is designated by 1 and has a surface 2. The semiconductor layer 1 in the present case consists of weakly n-doped silicon. According to the invention, semiconductor layers can be formed as desired, that is to say can be part of a semiconductor body and its doping can have been produced, for example, by epitaxy during the crystal growth, by neutron doping, by diffusion or by ion implantation. Alternatively, the semiconductor layer 1 can also represent the semiconductor body itself, for example a homogeneously doped silicon wafer.

The semiconductor layer 1 has a relatively low doping concentration in the range of less than $10^{18}$ cm$^{-3}$, in particular less than $10^{16}$ cm$^{-3}$. The doping concentration is therefore so low that, when making contact with the semiconductor layer 1 according to the prior art, only a Schottky contact would be formed at the metal-semiconductor junction 4. The metallization 3 is applied to the surface 2. In spite of the low doping of the semiconductor layer 1, this metallization 3 according to the invention forms a non-reactive metal-semiconductor junction 3. In order to ensure this, the metallization 3 consists of selenium or a material containing a great deal of selenium.

During the application of the metallization 3 to the surface 2, at the interface 4 between metal and semiconductor, an infinitesimally thin, selenium-containing doping layer 5 (crosses) is produced, possibly by means of a temperature step. This delta doping layer 5, as it is known, has a thickness in the range of a few layers of atoms, certainly has a very high selenium concentration, but because of their low solubility in silicon, and because of a lack of electrical activation and ionization, only a very small proportion of the selenium atoms are electrically active. The (electrically active) doping concentration in the remaining semiconductor layer 1 therefore remains to the greatest extent unchanged. However, this high concentration of selenium atoms at the interface 4 has the effect that a non-reactive metal-semiconductor contact is formed there.

FIGS. 3 and 4 show two further exemplary embodiments of a semiconductor contact according to the invention.

Figure 16:
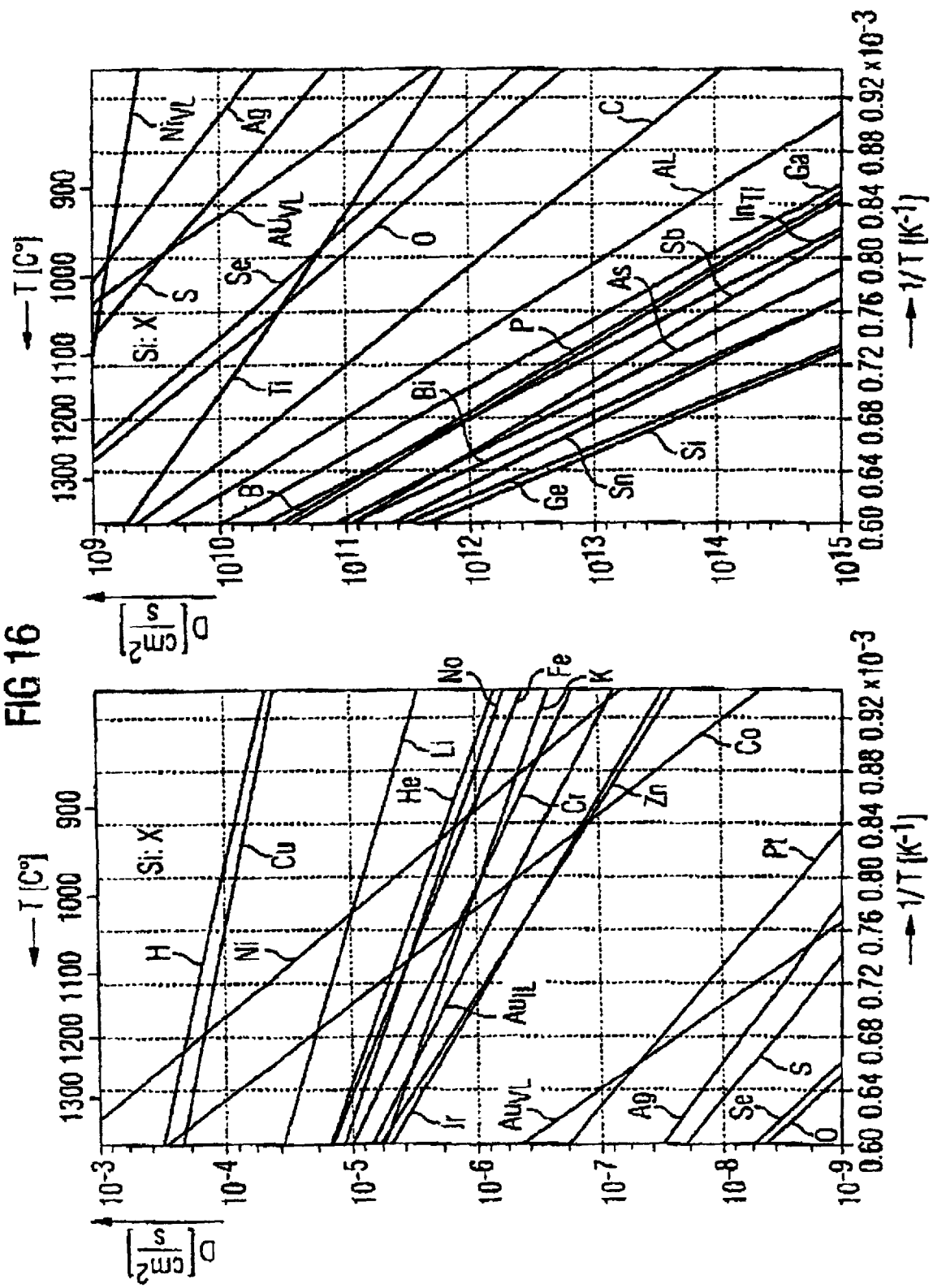
FIG. 16 shows the diffusion coefficients D of various doping elements in silicon as a function of the temperature T.

As distinct from the first exemplary embodiment (FIG. 2), in the second exemplary embodiment according to FIG. 3, the selenium metallization 3 is used at the same time to produce a selenium-doped layer 6 in the semiconductor layer 1. This can be brought about, for example, by means of a suitable injection process, in which the selenium atoms can diffuse into the semiconductor body with the aid of a comparatively low temperature. This doping method, that is to say coating with a following injection step, is particularly advantageously suitable for doping with selenium, since selenium, as compared with dopants normally used in n-doped semiconductor layers, such as arsenic and phosphorus, exhibits a very much higher diffusion coefficient (see FIG. 16). Because of the very high diffusion coefficients of selenium, the result is that even deeply selenium-doped layers can be produced. Because of the relatively low temperature budget of selenium, the injection process or the diffusion process for producing the selenium-doped layer is also possible relatively late, toward the end of the process. This is advantageous since, at this process stage, the existing doping profiles and the comparatively temperature-sensitive doped SiO$_2$ layers no longer permit high temperatures. Because of the relatively low temperatures for producing the selenium-doped layers, of typically 800° C. to 900° C. for at least a few seconds, the temperature-sensitive doping profiles or SiO$_2$ layers are not detrimentally affected. The non-reactive contact itself is produced by means of an interaction close to the surface between selenium and silicon at the interface. The interaction close to the surface can be assisted by means of local damage to the crystal at the surface, for example by means of ion implantation.

In the third exemplary embodiment according to FIG. 4, a selenium-doped layer 6 is likewise provided in the semiconductor layer 1, the selenium-doped layer 6 here again having a high selenium concentration far above the solubility limit. The selenium-doped layer 6 can be produced, for example, by means of ion implantation and a temperature step, for example RTA. As distinct from the exemplary embodiment in FIG. 3, a metal that is normally used, for example aluminum, is provided on the selenium-doped layer 6 as the metallization 3 for the metal-semiconductor contact 4.

FIG. 5 shows a fourth, very advantageous exemplary embodiment of a metal-semiconductor contact 4 according to the invention. Here, the selenium-doped layer 6 is embedded in a weakly n-doped semiconductor trough 7, the n-doped trough 7 in turn being embedded in a semiconductor layer 1 of any desired construction.

As distinct from the exemplary embodiment according to FIGS. 2 to 4, the contact 8 for the semiconductor layer 1 is constructed in many layers. Firstly, it comprises the already known metallization 3, which is applied directly at the interface 4 of the semiconductor layer 1. This is followed by an adhesive layer 9, which serves as an intermediate layer for better adhesion of the following layer. Applied to the adhesive layer 9 is a diffusion barrier layer 10, which is intended to prevent the following layer 11 for the conductor track coming into contact with the semiconductor surface 2, since otherwise uncontrollable diffusion and alloying processes could be started. Provided on the diffusion barrier layer 10 is a layer 11 for the conductor track, which, as a low-resistance layer, produces the actual electrical connection, for example to a bonding pad 12.

For the production of the contact 8, it is not necessary for all the aforementioned layers 3, 9, 10, 11 to be provided; instead one or more of these layers 3, 9, 10, 11 can be omitted, depending on the requirement.

In the following text, the action of the selenium-doped layer 6 or delta doping 5 according to the invention, in combination with the appropriate metallization 3, will be explained in more detail:

To make the contact, a dopant and/or a contact material should be used which itself has a doping action and, furthermore, has a metallic character. In this case, the dopant should have the same conductivity type as the corresponding semiconductor layer 1 with which contact is to be made. In the case of n-doped semiconductor layers, selenium in particular is suitable as the element, since in the silicon crystal interaction both as a donor and also, in what is known as its "gray modification", it conducts current to the same extent, that is to say exhibits a metallic character. "Gray modification" designates a crystal lattice modification which at least partly exhibits a metallic character.

If, then, selenium is used as the element, be it for the metallization (FIGS. 2, 3, 5) or for the production of a selenium-doped layer (FIGS. 3 to 5), then the result, in the semiconductor layer 1 lying under the semiconductor contact 3, is a non-reactive metal-semiconductor contact 4, even at a relatively low, electrically active dopant concentration. For this purpose, however, it is necessary for selenium to be introduced into the regions close to the surface of the semiconductor layer 1 in concentrations far above the saturation solubility limit, by means of ion implantation. In addition, or alternatively, selenium can also be applied to the surface as a thin compact layer. As a result of using selenium as contact material and/or as doping element, the electrically active doping in the region immediately under the contact is reduced significantly. Since this region has a very high effective concentration of selenium atoms, at least at the immediate surface 2, it is nevertheless possible for a non-reactive metal-semiconductor junction 4 to be achieved.

Figure 15:
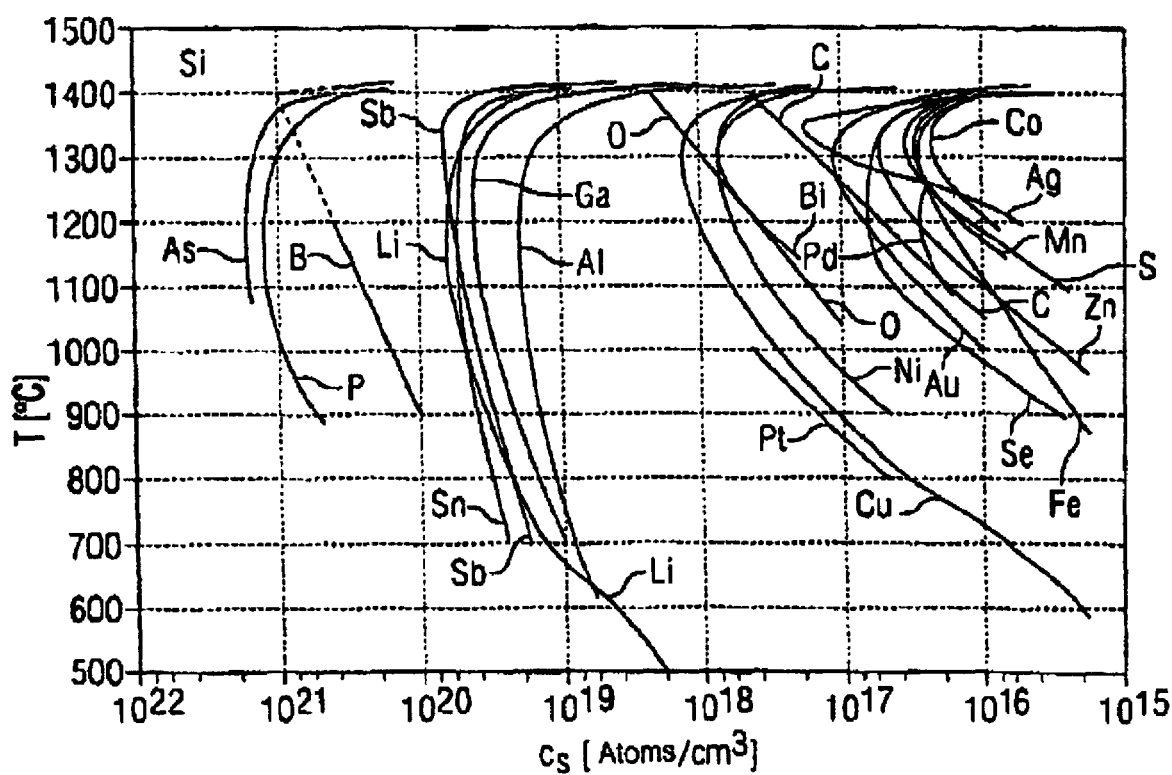
FIG. 15 shows the solubility Cs of various doping elements in silicon as a function of the temperature T.

The basic idea of the present invention is that selenium, which is used to make contact with or for doping the semiconductor layer 1, has a relatively low solubility in just this semiconductor layer 1. FIG. 15 reveals that selenium has a maximum solubility in crystalline silicon of about $8 * 10^{16}$ cm$^{-3}$ (at 1200° C.). As compared with n-doped substances which are conventionally used, for example arsenic or phosphorus, selenium therefore has a solubility in silicon which is lower by approximately the factor $10^4$. The solubility-temperature graph in FIG. 15 has been taken from H. Schaumburg, "Halbleiter" [Semiconductors], Teubner-Verlag, Stuttgart, 1991, FIG. 3.2.1–7.

If selenium is introduced into the semiconductor layer 1 with which contact is to be made in a concentration far above the solubility limit, for example in the region of more than $10^{19}$ cm$^{-3}$, then the high introduced selenium concentration required for making non-reactive contact with n-doped silicon, as described extensively at the beginning, is present. However, selenium has a solubility in silicon which is only a fraction of the aforementioned selenium concentration. The result of this is that only such a fraction of the introduced selenium atoms can also just be electrically active as donors.

When selenium is used, there is advantageously the additional effect that selenium is known as an element with incomplete ionization, that is to say at room temperature, selenium has an ionization level of only about 20%. Here, the ionization level is understood to mean the percentage of electrically active selenium atoms incorporated at lattice locations. This special feature results in the concentration of electrically active selenium atoms in silicon at room temperature even lying far below the maximum solubility limit.

Although, in the example explained above, a doping concentration of selenium was assumed which lies more than an order of magnitude above the solubility limit of selenium in silicon, it should be pointed out that a doping concentration far above the solubility limit in connection with the invention is already a doping concentration which is 2 times to 3 times the solubility limit, the doping concentration, as explained above, of course being able to lie far above this, in the range of one to several orders of magnitude of the solubility limit. In addition to selenium and bismuth, any further desired metallic or semimetallic materials can of course be used as dopants, being introduced into the semiconductor material with a concentration far above the solubility limit. As is known, semimetals are distinguished by the fact that they have a specific resistance between about 0.01 and 1 mOhm·cm. The specific resistance of metals, as is known, lies below about 0.01 mOhm·cm.

In addition to silicon, other semiconductor materials, such as gallium arsenide or silicon carbide, can also be used.

FIG. 6 shows, in a simplified cross section, a fifth exemplary embodiment of a metal-semiconductor contact according to the invention.

As distinct from the exemplary embodiment corresponding to FIGS. 2–5, the layer 13 underneath the metallization 3 does not contain any selenium doping here. The n-doped layer 13 introduced into the n-doped trough 7 has a very high dopant concentration, for example in the region of $10^{19}$ to $10^{21}$ cm$^{-3}$, in order as a result to ensure a non-reactive contact with the metallization 3. Here, any desired n-doped element, for example arsenic, phosphorus, indium and the like, can be used as the doping element. Alternatively, it would also be conceivable to use selenium here in accordance with the exemplary embodiments of FIGS. 2 to 5. In order to reduce the effectively active charge carrier concentration in the highly n-doped layer 13, according to the invention the charge carrier lifetime in this region is reduced drastically. The reduction in the effective charge carrier lifetime can in principle be carried out in two different ways:

1. For example, heavy metals 14 (stars) can be diffused into the layer 13 with very high doses. The heavy metal atoms 14 incorporated in the silicon semiconductor crystal act as recombination centers there. In order to reduce the charge carrier lifetime, in particular platinum is suitable since, although it has virtually no influence on the generation rates for majority charge carriers, it effects a very high recombination rate. In order to ensure a very high effectiveness of the platinum atoms diffused in, the concentration of the electrically active platinum ions in the doped layer 13 should be at least as great as the concentration of the n-doped substances there. Equally, however, it should be ensured that the concentration of the platinum atoms outside the n-doped layer 13 is as low as possible, in order not to influence the electrical properties of the semiconductor layer in a negative way.

The recombination centers 14 within the n-doped layer 13 can be produced, for example, by means of a suitable precoating, for example by means of ion implantation or a silicide layer, with a following, very short temperature step at very high temperature. For this injection step, the RTP method (Rapid Thermal Processing) is particularly suitable, since as a result it is possible to ensure that the semiconductor body is subjected to a defined temperature only for a very short time. If the semiconductor layer 1, and therefore also the layer 13, is subjected to a temperature and/or a higher temperature than envisaged for a relatively long time, then the heavy metal atoms serving as recombination centers 14 can undesirably act as recombination centers in the remaining regions of the semiconductor layer 1 as well, which is to be prevented without fail.

2. In a second method, the charge carrier lifetime in the layer 13 can also be reduced in a defined manner by the deliberate production of crystal damage or radiation damage, for example by means of irradiation or ion implantation at low energies. In the layer 13, this crystal damage forms recombination centers 14 which therefore, in a manner equivalent to that described under 1., effect a reduction in the effective charge carrier concentration. However, crystal damage or radiation damage in the silicon crystal is to some extent healed even at relatively low temperatures, such as occur during the mounting of semiconductor chips or during the annealing of metallizations. This means that the component characteristics can still change from the finally processed wafer to the finally encapsulated semiconductor element. This must be taken into account without fail by means of clever process management during the production of the crystal damage, so that it is ensured that the finally produced semiconductor component has the desired characteristics.

FIG. 7 shows, in a part section, the first application of the metal-semiconductor contact according to the invention for making contact with the source zones of a MOSFET. Here, the MOSFET is formed as a vertical n-channel power-D-MOSFET.

In FIG. 7, 20 designates a semiconductor body, for example a monocrystalline silicon wafer. The semiconductor body 20 has a first surface 21, known as the wafer front side, and a second surface 22, known as the wafer rear side. The semiconductor body 20 contains a weakly n-doped inner zone 23 adjoining the wafer front side 21. In the direction of the wafer rear side 22, a highly n-doped drain zone 24 adjoins the inner zone 23. The drain zone 24 is connected to the drain terminal D by a drain metallization 25 applied to the surface 22 over a large area.

On the opposite surface 21, a plurality of p-doped body zones 26 are embedded in the form of troughs in the inner zone 23. One or more weakly doped source zones 27 are embedded in a body zone 26 in each case. The body zones 26 and source zones 27 can be introduced into the semiconductor body 20 in a known manner by means of ion implantation or diffusion. The body zones 26 are spaced apart from one another on the surface 21 by an intermediate zone 28, which is a constituent part of the inner zone 23. Provided above the intermediate zones 28 in each case is a gate electrode 29, which, extending laterally, reaches above the source zones 27. The gate electrodes 29 are insulated with respect to the surface 21 by a thin gate oxide 30. The regions of the body zone 26 which are arranged above the gate electrodes 29 therefore define a channel zone 31, in which, when a gate potential is applied to the gate terminal G and a drain-source voltage is applied to the corresponding drain and source terminals D, S, a current-carrying channel brought about by charge inversion can form. Also provided is a source electrode 32 for making contact with the source zones 27, which will be described in more detail below. The source electrode 32 is spaced apart from the gate electrode 29 by a protective oxide 33. The source electrode 32 is connected on the wafer front side 21 to a source terminal S, the gate electrode 29 is connected to a gate terminal G.

The gate electrodes 29 typically consist of polysilicon, but they can also consist of another material, for example of metal or silicide, even if the last-named materials are not as advantageous as highly doped polysilicon, in terms of production and because of their physical and electrical properties. Equally, any other insulating material, for example silicon nitride ($Si_3N_4$) or else a vacuum can be used instead of silicon dioxide ($SiO_2$) for the gate oxide 30 and the protective oxide 33, but thermally produced silicon dioxide, in particular when used as the gate oxide 30, has the highest quality and is therefore to be preferred.

The large-area drain metallization 25 used is typically aluminum, but any other highly conductive material which ensures good contact with the semiconductor body 1 could also be used here.

In the layout of the semiconductor body 20, the regions covered with gate electrodes 29 and with body zones 26 and source zones 27 designate the cell array of the power MOSFET, comprising a large number of cells, only three cells from this cell array being illustrated as a detail in FIG. 7. In each case a cell contains an individual transistor. The parallel connection of the load paths of the large number of individual transistors then results in the power MOSFET.

In the exemplary embodiment in FIG. 7, the MOSFET has non-reactive metal-semiconductor contacts 35 according to the invention for making contact with the source zones 27, the contact 35 merely having been indicated here by hatching. The regions 34 with the non-reactive metal-semiconductor contacts 35 according to the invention can be designed in accordance with an exemplary embodiment illustrated in FIGS. 2 to 6. The source electrode 32 for the MOSFET thus makes contact only with the source zones 27 and no longer, as in the case of known MOSFET structures, with the body zone 26 as well.

In the following, the mode of action of the contacts according to the invention in a MOSFET will be explained:

As a result of the use of selenium as contact material in accordance with one of the exemplary embodiments of FIGS. 2 to 5, the electrically active doping concentration in the source zones 27 of the MOSFET can be reduced drastically, and nevertheless the source zone 27 can at the same time have non-reactive contact made with it. As a result of the reduction in the doping concentration in the source zones 27, the emitter characteristic of the parasitic bipolar transistor T1 is reduced in such a way that when the MOSFET is switched on, a hole current flowing out of the body zone 26 barely effects any injection of electrons from the source zones 27 into the body zone 26.

The current amplification factor β, which is determined by the doping concentration in the source zone 27 and body zone 26, can as a result be reduced to very low values, in the region of 1 or below, even during normal operation of the MOSFET. At such low current amplification factors β, the parasitic bipolar transistor will virtually never respond under operating conditions of the MOSFET, that is to say with an applied drain-source voltage and a gate potential. The MOSFET therefore exhibits a very high latch-up resistance under operating conditions. It is therefore possible to dispense with the source-body short-circuit, which serves to prevent the parasitic bipolar transistor turning on. The MOSFET therefore no longer has a co-integrated inverse diode between body and drain, which is inherent to all known integrated MOSFET structures. Because of dispensing with the short-circuit of source zone 27 and body zone 26, the MOSFET according to the invention is given a high blocking capacity, even in reverse operation, and nevertheless retains a very high latch-up resistance.

A further advantage of the contact 35 according to the invention is that it is possible to dispense with the very complicated production process for producing a short-circuit between body and source. This production step, in particular in a MOSFET arrangement corresponding to FIG. 7, constitutes a process which is difficult and is very critical in production terms. The semiconductor components produced in this way therefore also have, in addition to improved electrical characteristics, the advantage that they can be produced more simply and therefore also more cost-effectively.

In FIG. 7, the invention was illustrated by using a D-MOSFET. However, the invention is not to be restricted just to D-MOSFETs, but within the scope of the invention is to be expanded to all MOSFETs. In the following FIGS. 7a–7b, the invention will be explained by using two further MOSFET topographies.

FIG. 7a shows a semiconductor component which is designed as an n-channel power MOSFET on the principle of charge carrier compensation. The MOSFET in FIG. 7a is distinguished with respect to that in FIG. 7 in that the inner zone 23 (drift zone) additionally has a compensation layer 36. The compensation layer 36, which in a compensation component inherently has the function of the drift section and thus serves to absorb a blocking voltage, has doping regions 37, 38 of both conductivity types arranged alternately beside one another, which form the compensation structures. The p-doped regions 37 will also be referred to as clearing zones below, while the n-doped regions 38 will be referred to as complementary clearing zones. The construction and the functioning of such compensation semiconductor components is widely known and, for example, described in U.S. Pat. No. 5,216,275 and U.S. Pat. No. 5,754,310 and also in WO 97/29518, DE 43097 C2 and DE 198 40 032 C1. The entire content of the subject of these documents is hereby incorporated in the present patent application.

In FIG. 7a, the clearing zones 37 and complementary clearing zones 38 are not connected to the drain zone 24 on the rear side, that is to say the weakly n-doped drift zone 23 is arranged between the zones 37, 38. The zones 37, 38 are therefore formed in the compensation layer 36 in a more or less floating manner. However, it should be pointed out that these zones 37, 38 can of course also be connected to the drain zone 24. Furthermore, these zones 37, 38 are adjusted to the pattern of the cell array of the MOSFET, but an arrangement of these zones 37, 38 not adjusted to the cell array would also be conceivable.

On the wafer front side 21, the MOSFET has metal-semiconductor contacts 35 according to the invention. Here, contact is made between the source zones 27 and the source electrode 32 via a contact hole. Making contact between source electrode 32 and the body zones 26 in order to produce a short-circuit between body zone 26 and source zone 27 is not envisaged. The source zone 27 advantageously has a lower doping concentration than the body zone 26 and, by means of the metal-semiconductor contacts 35 according to the invention, nevertheless ensures a non-reactive contact between the metal 32 and semiconductor body 20. The high doping concentration in the body zone 26 leads to there being virtually no current amplification toward the source electrode 32, which means that better dimensioning of the semiconductor component is possible.

The MOSFET in FIG. 7a has a further, not necessarily required but advantageous, configuration. The body zone 26 here has what is known as a "retrograde well" 39. A body zone 26 configured in this way has increased p-doping, the maximum of the doping concentration being offset into the depth of the body zone 26, that is to say away from the source zone 27. The channel zone 31 therefore has a very low doping concentration, so that as a result a defined turn-on voltage can be set. However, the remaining regions outside the channel zone 31 have a high doping concentration, which is at least considerably higher than the doping concentration in the source zone 27, which means that the current amplification from the body zone 26 toward the source electrode 32 becomes minimal. It is important that the region 39 has a high doping concentration, at least with respect to the channel zone 31. For example, the region 39 has a doping dose of about $10^{14}$ cm$^{-2}$, while the region 31 has a doping dose of about $10^{13}$ cm$^{-2}$.

Such a "retrograde well" 39 within the body zone 26 may be produced, for example, by means of depth implantation and subsequent healing and/or diffusion steps. When the build-up technique, as it is known, is used, in which successive different epitaxial layers with suitable structuring and doping are deposited on one another, the higher doping concentration of the body zone 26 could also be produced by planar implantation on the penultimate epitaxial surface. Forming the body zone 26 as a retrograde well 39 may of course also be used in a D-MOSFET structure according to FIG. 7. However, a body zone 26 with a retrograde well 39 is particularly advantageous when used in a MOSFET on the principle of charge carrier compensation, since there, as a result of the structure of the clearing zones 37 and complementary clearing zones 38, a field profile and current profile are provided which are further optimized by the special structure of the body zone 26.

FIG. 7b illustrates a MOSFET on the principle of charge carrier compensation produced using trench technology. Applied to the compensation layer 36 is a layer-like body zone 26, which can be produced by means of epitaxy, for example, on which in turn the source zone 27 has been applied in the form of a layer. The upper region of the source zone 27 on the wafer front side 21 is selenium-implanted. The MOSFET has trenches 60 which project from the wafer front side 21 into the depth of the semiconductor body 20 as far as the compensation layer 36. Arranged in a trench 60 in each case is a gate electrode 61 which is formed from highly n-doped polysilicon and which is spaced apart from the semiconductor body 20 by an oxide 62.

In a conventional MOSFET produced in a trench technology, the trench contact for making contact with the body zone requires a very large amount of chip area. This trench contact is the limiting factor for a further reduction in the cell spacing (pitch). In the case of the trench MOSFET according to the invention, such a trench contact is no longer required, since here contact has to be made only between the source electrode 32 and the source zones 27 but not the body zones 26. The source zones 27 therefore have large-area metal-semiconductor contacts 35 arranged on the wafer front side 21. In this way, the trenches 60 may advantageously be arranged very much closer to one another, which ultimately permits a lower pitch and therefore a significant saving of chip area with the same power capability of the MOSFET.

When the metal-semiconductor contacts according to the invention are used in MOS structures corresponding to those shown in FIGS. 7, 7a and 7b, the result is the fundamental advantage that the source zone 27 can be produced with conventional dopants with low diffusion edges. The actual contact can then be made subsequently, with the contact hole already opened, by selenium being implanted in the open contact hole with low energy and the appropriate implantation dose. A temperature step is then also carried out (for example by means of RTA), in which the implanted selenium dose is healed and electrically activated.

Figure 8:
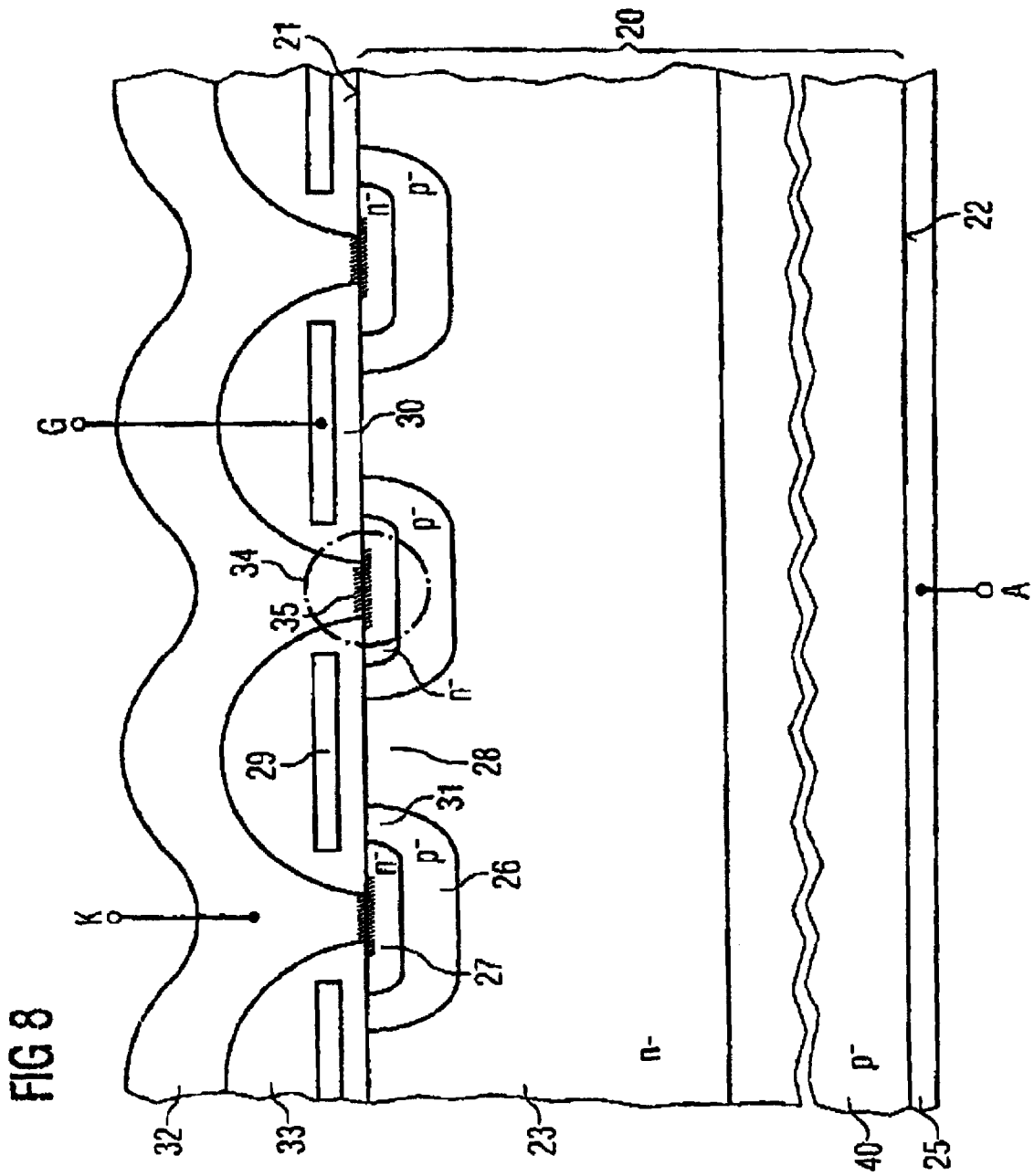
FIG. 8 shows, in a part section, a second application of the metal-semiconductor contact according to the invention for making contact with the source zones of a vertical n-channel IGBT.

FIG. 8 shows, in a part section, a second application of the metal-semiconductor contact according to the invention for making contact with the source zones of a vertical n-channel IGBT.

The IGBT in FIG. 8 differs from the power MOSFET corresponding to FIG. 7 substantially in the fact that the highly n-doped drain zone 24 arranged on the wafer rear side 22 in the power MOSFET is now formed as a weakly p-doped anode zone 40. Furthermore, the inner zone 23, the body zone 26, but in particular the source zone 27, is also weakly n-doped or p-doped. Moreover, here the source terminal S is designated the cathode terminal K and the drain terminal D is designated the anode terminal A.

In an IGBT, the latch-up risk is unequally higher than in a MOSFET, because of its four-layer structure and the hole current that flows to the source zone 27 at each switch-off. Here, too, the body zones have hitherto always had to be very highly doped, which requires particularly low-resistance layers to dissipate hole currents toward the cathode contact. These measures are required, since IGBTs are operated in the same voltage class with distinctly higher current densities than MOSFETs. The reverse blocking capability, which in the case of IGBTs is provided by the pn junction between the anode zone 40 and the inner zone 23, is increased still further by the lack of a short-circuit between body zone 26 and source zone 27.

FIG. 9 shows a third application of the metal-semiconductor contact 35 according to the invention in an integrated arrangement of MOSFETs and IGBTs connected in parallel with one another.

FIG. 9 shows a detail of a semiconductor body 1, in which a MOSFET, in each case comprising two cells (left-hand cells) in the configuration corresponding to FIG. 7, and also an IGBT comprising a single cell (right-hand cell) in the configuration corresponding to FIG. 8 are integrated in a semiconductor body 1. This integrated arrangement has a highly n-doped drain zone 24 adjoining the surface 22, and a weakly p-doped anode zone 40 spaced apart therefrom. Contact is in each case made with the two zones 24, 40 by the same electrode 25. The drain zone 24 and/or the anode zone 40 can, for example, be produced by separate ion implantation at low energies via the wafer rear side 22. The distance between two adjacent anode zones 40 is a question of the dimensioning of the two semiconductor components (IGBT, MOSFET); this distance is required in order that the IGBT fires in an adequately defined manner. In a very advantageous refinement, the inner zone 23 is very weakly ($n^{--}$) doped. Arranged between this weakly doped inner zone 23 and the drain zone 24 and anode zone 40 is a further n-doped layer 23'. This zone 23' is formed as an n-doped field stop zone.

The two semiconductor components have a substantially similar topology, so that for the production of the remaining structures, such as the body zones 26, source zones 27, gate oxide 30, gate electrodes 29, source electrodes 32, etc., substantially the same or similar technological processes can be used.

By means of the integration of a MOSFET and an IGBT corresponding to FIG. 9, a novel, integrated semiconductor component can be provided which, in the equivalent circuit diagram, represents a parallel circuit of a MOSFET and an IGBT. This novel semiconductor component could hitherto be provided discretely only in a very complicated way. The particular advantage of the novel IGBT/MOSFET semiconductor component is that it combines the advantages of a MOSFET and an IGBT with each other.

This becomes clear from the simplified current-voltage characteristic curve corresponding to FIG. 10. The characteristic curve of a single MOSFET is designated (a) in FIG. 10, and the characteristic curve of an individual IGBT is designated (b). A MOSFET is normally suitable for lower voltages, while an IGBT, which has a higher current carrying capacity as compared with the MOSFET, is designed more for high voltages and current densities. The novel IGBT/MOSFET semiconductor component according to the invention has approximately a characteristic curve corresponding to curve (c). According to this characteristic curve, the MOSFET, in normal operation, that is to say up to a voltage $U_0$, carries virtually the entire current. At very high currents, the IGBT increasingly takes over the current from the MOSFET. The particular advantage of this arrangement is that the power losses, which likewise increase sharply in a MOSFET with increasing current densities, are reduced considerably here by the IGBT switching on. This advantage is manifested clearly in particular in high-voltage components.

The MOSFET described, with monolithically integrated IGBT, as opposed to previously known IGBT structures with emitter short-circuits ("emitter shorts") in the p-doped rear emitter, has a reverse blocking capability which cannot be disregarded.

Of course, the curves in FIG. 10 have been very highly simplified; the real characteristic curve typically has no inflection at the voltage $U_0$, but a continuous transition.

FIG. 11 shows, in a part section, a fourth application of the metal-semiconductor contact according to the invention for making contact with the cathode zone of a pin power diode.

The pin power diode comprises a semiconductor body 20 with two surfaces 21, 22. One surface 22 is adjoined by a p-doped anode zone 41, with which contact is made over a large area via an anode contact 42. On the opposite side, a weakly n-doped zone 43 adjoins the anode zone 41. This is adjoined by a weakly n-doped cathode zone 44. On the other surface 21, contact is made with the cathode zone 44 by a non-reactive metal-semiconductor contact 35 according to the invention, which is merely indicated hatched here. Here, the contact 35 can again be formed in accordance with one of the exemplary embodiments 2 to 6.

Instead of the use of a weakly n-doped zone 42 (ν-doping), this could also be weakly p-doped (π-doping) or have an intrinsic doping concentration. The contacts 35 according to the invention may in this way equally be used very advantageously on diode structures configured in any desired way, for example Schottky diodes, pn diodes and the like.

Conventional pin diodes typically comprise a p-doped anode on an n-doped basic material, which is adjoined by the cathode. Strictly speaking, this is a pn⁻n diode, which is technically more widespread. In order to reduce the switching power losses of such a pin diode, it is necessary that, in forward operation of the diode, the charge carrier flooding toward the cathode, which normally also forms the rear side of the semiconductor body, at least does not rise or, in the ideal case, even falls slightly. Further boundary conditions in the design of such a pin diode make it necessary for the basic doping in the inner zone of the pin diode to be low and for the electrically active thickness of the semiconductor body to be low. In order to implement such a pin diode, hitherto a doping concentration increased towards the cathode or the rear side, in which concentration the electric field was dissipated, was required. The doping concentrations of the zones, which can be formed as field stop zones or buffer zones, for example, are therefore dimensioned such that the charge lies just above the breakdown charge. The doping concentration of the emitter zone on the cathode side must be correspondingly weak.

The implementation of such pin diodes was hitherto possible only with an epitaxial base material or with appropriate field stop technologies and a rear side emitter, whose effectiveness was reduced by suitable measures. In the case in which epitaxial base material was used, this could be achieved only by deep, local irradiation being performed in order to reduce the charge carrier lifetime.

By means of metal-semiconductor contacts 35 according to the invention, pin diodes according to the invention and corresponding to FIG. 11 can be provided, which are dimensioned such that they exhibit low flooding with charge carriers in the inner zone in the event of breakdown, even without means for reducing the lifetime. This is to be explained in more detail below using the graph shown in FIG. 11a. FIG. 11a shows a known charge carrier concentration n=p (dashed curve) in a pn⁻n diode in forward operation. In this case, use was made of a conventional weak rear side emitter, in which no means for reducing the charge carrier lifetime were carried out. The abscissa shows the electron and hole density n=p on a linear scale. The difference between the two cannot be seen, since the flooding charge exceeds the basic doping by more than the factor 50. The dotted line shows the basic doping $N_A$, $N_D$. The continuous line $N_{target}$ designates the intended charge carrier distribution in forward operation, which falls off slightly from the p⁻-doped wafer front side (x=0 μm) toward the weakly n-doped wafer rear side (x>120 μm). The reference point of this straight-line, that is to say the point of intersection with the abscissa, is determined by the doping concentration of the respective emitter. The dimensioning of a semiconductor component corresponding to FIG. 11a can of course be adapted in a suitable way to the respectively desired blocking voltage.

In the present invention, the rear side emitter and the field stop zone are produced with a single selenium implantation with a following temperature process. The selenium implantation is introduced into the semiconductor body with a very high selenium implantation dose. The following temperature step is carried out, for example, by means of RTA (rapid thermal annealing). This ensures that the efficiency of the n-doped emitter produced via the selenium implantation is substantially lower than corresponding conventional emitters produced with the same implantation dose which are implanted, for example, with phosphorus or arsenic. Because of its high diffusion coefficient (see FIG. 16), the selenium atoms diffuse out of the n-emitter by about 1–5 μm during the temperature process and therefore automatically supply the required field stop zone.

FIG. 11a shows the doping and charge carrier profile of such a diode, 41 designating the anode zone, 43 the weakly n-doped zone and 45 the field stop zone. The cathode zone 44, which forms the n-emitter, is not illustrated in FIG. 11a, but adjoins the field stop zone 44. In FIG. 11a, the field stop zone 45 has a thickness d=120 μm–100 μm=20 μm. The thickness d of the field stop zone 45 is much too low, however, to influence the switching behavior of the pin diode noticeably, that is to say to have the undesired effect here of a 'soft switching behavior'.

The particular advantage of this application therefore consists in that, in order to produce the n-doped emitter and the field stop zone 45, only a single implantation step has to be performed, and no further measures are required to reduce the efficiency of the rear emitter. The total amount of charge carriers in the field stop zone 45 can be set in a defined way via the temperature of the RTA temperature process and via the solubility of the selenium atoms. It is therefore possible to provide pin diodes with a very low storage charge at a low chip thickness, which nevertheless have a very good blocking behavior. Typical selenium implantation doses for producing the rear side emitter 44 and the field stop zone 45 lie in the range between $10^{13}$ and $10^{16}$ cm⁻³. The temperature process is typically carried out at temperatures in the range between 950° C. and 1200° C., the plateau times for this temperature step lying in the range from 1 second to 2 minutes.

A further advantage of this method is that, in the region of the wafer rear side close to the surface, there is an increased density of silicon defects, which additionally promote the implementation of a metal-semiconductor contact formed non-reactively between the n-doped semiconductor body and the metallization. The basic idea of using non-reactive semiconductor-metal contacts according to the invention is that, when used in a pin power diode, they reduce the efficiency of the n-emitter in such a way that said efficiency is lower than the efficiency of the p-emitter. As a result, non-reactive contacts can be produced on n-doped semiconductor material, which means that a higher degree of freedom in dimensioning such a pin power diode becomes possible. In this way, diodes optimized with regard to the turn-off losses can be produced.

FIG. 12 shows, in a part section, a fifth application of the metal-semiconductor contact according to the invention in an integrated arrangement of a MOSFET and a freewheeling diode arranged in parallel therewith. The MOSFET (two left-hand cells) is formed here in accordance with FIG. 7, while the freewheeling diode (right-hand cells) exhibits a structure modified with respect to FIG. 11.

In the MOSFET/freewheeling diode arrangement corresponding to FIG. 12, the cathode zone 44 and the cathode contact of the freewheeling diode are formed by the inner zone 23 and the drain zone 24. The drain terminal D thus equally forms the cathode terminal K. In order to produce the p-doped anode zone of 41, the same process for producing the p-doped body zones 26 can advantageously be used. Contact with the anode zone 41 is made by means of a contact hole. Equally, the source electrode 32 serves as the anode contact A.

Since contact is made with the source zones 27 by means of non-reactive metal-semiconductor contacts 35 according to the invention, it is possible to dispense with a short-circuit between body zone 26 and source zone 27. Nevertheless, the body zone 26 can be very lowly doped without the risk of a latch-up effect having to be tolerated. Since the body zones 26 and therefore also the anode zone 41 are very lowly doped, the freewheeling diode can now be co-integrated into the semiconductor body 20.

The parasitic MOSFET diode, which is typically present as a result of the short-circuit between body zone and source zone 26, 27, normally leads to high charge carrier flooding in the inner zone 23, because of the high doping in the base zone 26 and the resultant very high efficiency of the anode emitter. Because of this high charge carrier flooding, a co-integrated freewheeling diode hitherto exhibited high turn-off losses and, additionally, an unfavorable switching behavior. By means of the metal-semiconductor contact according to the invention, the body doping can be dimensioned to be relatively low, which then leads to relatively low flooding of charge carriers. As a result, however, freewheeling diodes can advantageously be co-integrated into the semiconductor body of a power MOSFET. For reasons of cost, this application is of special interest in particular in the case of very small chips.

If the MOSFET is modified as an IGBT according to the exemplary embodiment in FIG. 8, the freewheeling diode can also be co-integrated into an IGBT semiconductor component.

In the case of previously known MOSFETs and IGBTs, the freewheeling diode required for this purpose could typically not be integrated, but had to be provided discretely. The reason for this, amongst other things, was that a different technology was required for the respective components. Furthermore, the diode heat radiated by the diode had a negative back-effect on the electrical characteristics of the MOSFET or the IGBT. For this reason, in the case of previously known topographies, a freewheeling diode co-integrated into a semiconductor body with MOSFET or IGBT had to have a very large lateral spacing from these components, so that here, no chip area saving resulted from the integration.

The fact that the IGBTs and MOSFETs according to the invention now have a reverse blocking capability means that a freewheeling diode which is optimized with regard to its switching behavior can also be co-integrated. The advantage of this arrangement consists in a significant saving in chip area and the ability of these semiconductor components to be produced and mounted simply.

Figure 13:
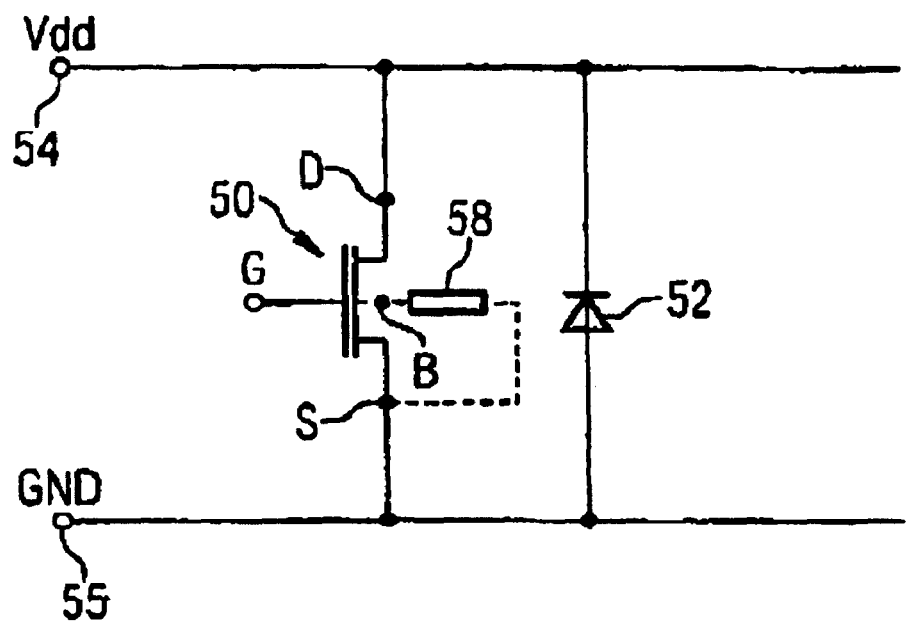
FIG. 13 shows the equivalent circuit diagram of the arrangement corresponding to FIG. 12.

FIG. 13 shows the equivalent circuit diagram of an arrangement corresponding to FIG. 12. The second diagram shows the MOSFET 50, which is arranged with its load path between a first terminal 54 with a first supply potential Vdd and a second terminal 55 with a second supply potential GND. The MOSFET according to the invention 50, as compared with previously known MOSFETs which have a body-source short-circuit, has no inverse diode between its source and drain terminals S, D. Arranged in parallel with the load path of the MOSFET and therefore likewise between the terminals 54, 55 is the optimized freewheeling diode 52.

As an option, a resistor 58 could be provided in the circuit arrangement in FIG. 13. The resistor 58 could, for example, be a polysilicon resistance section. This integrated resistor 58 can particularly advantageously be integrated in a MOSFET 50 which has a strip cell design. For stability reasons, this resistor 58 should have a high resistance, that is to say a low conductivity value, in order in this way to carry a low current. Although such a circuit arrangement would lead to slight reverse currents, these are negligibly low as compared with the forward current.

This integrated resistor 58 is arranged between the terminal of the body zone B and the terminal for the source zone S. The integrated resistor 58 is substantially formed by the semiconductor material in the body zone 26.

Figure 14:
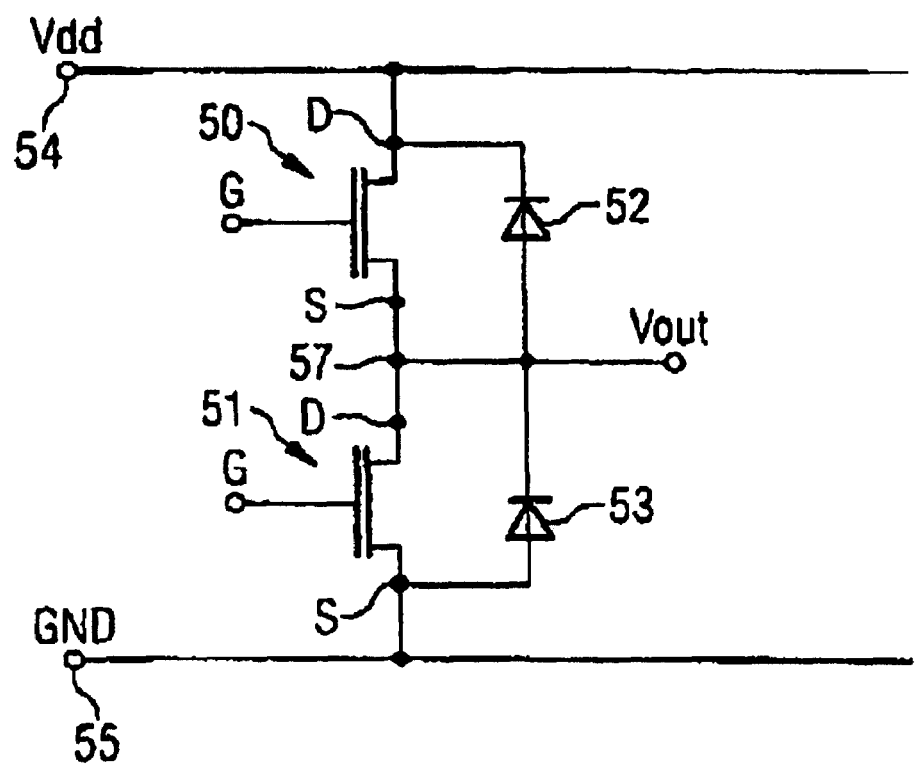
FIG. 14 shows a circuit diagram for the use of a MOSFET according to the invention with integrated freewheeling diode in a bridge circuit.

FIG. 14 shows a circuit diagram for the use of MOSFETs according to the invention with integrated freewheeling diode in a half-bridge circuit. The half-bridge circuit here comprises two reverse-blocking and latch-up resistant MOSFETs 50, 51, which can be configured in accordance with FIG. 7, for example. The drain-source load paths of the two MOSFETs 50, 51 are connected in series and arranged between the terminals 54, 55. The two MOSFETs 50, 51 may be controlled via their gate terminals G. The output signal Vout of the half-bridge arrangement can be tapped off at the center tap 57 of the load paths of the MOSFETs 50, 51. In each case a freewheeling diode 52, 53 co-integrated into the topology of the MOSFET 50, 51 or arranged in parallel in a second chip is arranged in parallel with the load paths of the two MOSFETs 50, 51. These freewheeling diodes 52, 53 can be formed as a pin power diode corresponding to FIG. 11, for example in the case of a high voltage application, or, in the case of a low voltage application, also as a Schottky diode not illustrated in the figures. This arrangement is very interesting in particular in the case of very large semiconductor chips. In the case of contemporary low voltage MOSFETs, the freewheeling diodes must be designed as Schottky diodes. Using the reverse-blocking MOSFETs described above, considerably more cost-effective pn- and pin-diodes can be used.

In all the above exemplary embodiments, in each case selenium was used as the contact substance for the metallization 3 and as the dopant for the n-doped layer 6. As already mentioned, selenium is suitable because of its very low solubility in silicon and is particularly advantageous because of its very high diffusion coefficient in silicon. However, it should be pointed out that, instead of selenium, other elements, which at least to some extent have similarly good diffusion coefficients and solubilities in silicon and which simultaneously act as a dopant in silicon, can be used. It is important only that these substances act in the highest doping manner in the semiconductor body with which contact is to be made and, at the same time, have a metallic or metal-like character. Furthermore, these substances should have a very much lower solubility as compared with conventional dopants and, furthermore, have the best possible diffusion coefficient.

Instead of selenium, therefore, use could also be made of bismuth, which is likewise an n-doping substance in silicon. Furthermore, bismuth has a very low solubility (less than 8 * $10^{17}$ $cm^{-3}$ at 1300° C.) and a relatively high diffusion coefficient (see FIGS. 15, 16).

The invention is not to be restricted only to metal-semiconductor contacts 35 on n-doped semiconductor layers 1, 27. Instead, by means of suitable substances and methods, metal-semiconductor contacts 35 on p-doped semiconductor layers can be modified in an equivalent way, but the effect of the invention is particularly advantageous in metal-semiconductor contacts 35 on n-doped semiconductor layers 1. By interchanging the conductivity types n and p and by modifying the dopant concentrations, any desired number of equally advantageous exemplary embodiments and modifications of the invention can be provided.

In all the exemplary embodiments of the figures, in each case vertically formed semiconductor components have been illustrated. However, the invention is not to be restricted only to vertical topologies but may also be expanded very advantageously to lateral semiconductor components or semiconductor components with trench structures.

In the preceding exemplary embodiments, the invention has been explained by using MOSFETs, IGBTs and diodes. However, the contacts according to the invention can be used in all desired semiconductor components, for example in thyristors, GTOs, JFETs, bipolar transistors and the like. Furthermore, the invention has been described substantially by using power semiconductor components, but of course an application in low voltage or smart-power semiconductor components would also be conceivable.

In summary, it can be recorded that, as the result of using dopants such as selenium, bismuth and palladium as dopant or as metallization, in a complete departure from known semiconductor contacts, non-reactive contacts can be provided at far lower doping concentrations.

By using the description above, the present invention has been presented in such a way in order to explain the principle of the contacts according to the invention and their practical application in the best possible way, but of course the present invention can also be modified in a suitable way within the context of the actions and knowledge of those skilled in the art.

We claim:

1. A metal-semiconductor contact, comprising:
   a doped crystalline semiconductor layer having a doping concentration introduced into said semiconductor layer and an electrically active doping concentration;
   a metallization applied to said semiconductor layer, said metallization and said semiconductor layer forming a non-reactive metal-semiconductor contact;
   a doping material forming a dopant in said semiconductor layer, said doping material having a solubility limit ensuring that said electrically active doping concentration in said semiconductor layer is always a fraction of said doping concentration introduced into said semiconductor layer, wherein said doping concentration is far above said solubility limit and said electrically active doping concentration is less than $10^{18}$ cm$^{-3}$.

2. The metal-semiconductor contact according to claim 1, wherein said semiconductor layer has recombination centers that reduce an effective charge carrier lifetime.

3. The metal-semiconductor contact according to claim 2, wherein said recombination centers are formed by heavy-metal atoms.

4. The metal-semiconductor contact according to claim 2, wherein said recombination centers are formed by platinum atoms.

5. The metal-semiconductor contact according to claim 1, wherein said metallization has a doping element which, when said metallization is applied to said semiconductor layer, forms a layer that is only as thick as a few layers of atoms in said semiconductor layer and contains said doping element.

6. The metal-semiconductor contact according to claim 1, wherein said metallization has a doping element that exhibits a high diffusion coefficient in said semiconductor layer and said doping element, when said metallization is applied to said semiconductor layer and when temperature is applied, forms a doped layer in said semiconductor layer.

7. The metal-semiconductor contact according to claim 1, wherein:
   said doping material is a metallic or semimetallic element, which acts in a doping manner in said semiconductor layer; and
   said doping material has a conductivity type and a very much lower solubility in said semiconductor layer as compared with conventional dopants of the conductivity type.

8. The metal-semiconductor contact according to claim 1, wherein:
   when said semiconductor layer is an n-doped semiconductor layer, said doping material is selenium and/or bismuth; and
   when said semiconductor layer is a p-doped semiconductor layer, said doping material is palladium.

9. The metal-semiconductor contact according to claim 1, wherein said doping concentration introduced into said semiconductor layer is substantially formed by doping materials that have a solubility limit and a doping concentration far above said solubility limit.

10. The metal-semiconductor contact according to claim 1, wherein said electrically active doping concentration is less than $10^{16}$ cm$^{-3}$.

11. The metal-semiconductor contact according to claim 1, wherein said semiconductor layer has n-doped majority charge carriers.

12. A method of producing the metal-semiconductor contact according to claim 1, which comprises: after applying a metal for a metal-semiconductor contact, subjecting regions of the semiconductor layer close to a surface immediately under the metal-semiconductor contact to a temperature treatment and/or a process for producing damage.

* * * * *